(12) United States Patent
Lee et al.

(10) Patent No.: US 12,376,378 B2
(45) Date of Patent: Jul. 29, 2025

(54) DISPLAY DEVICE AND METHOD OF FABRICATING THE SAME

(71) Applicant: Samsung Display Co., LTD., Yongin-si (KR)

(72) Inventors: Jong Chan Lee, Yongin-si (KR); Jin Taek Kim, Yongin-si (KR); Hyun Kim, Yongin-si (KR); Jeong Su Park, Yongin-si (KR); Woong Hee Jeong, Yongin-si (KR); Jung Eun Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 549 days.

(21) Appl. No.: 17/877,524

(22) Filed: Jul. 29, 2022

(65) Prior Publication Data

US 2023/0154937 A1    May 18, 2023

(30) Foreign Application Priority Data

Nov. 18, 2021   (KR) .......................... 10-2021-0159623

(51) Int. Cl.
| | |
|---|---|
| *H10D 86/60* | (2025.01) |
| *H01L 23/00* | (2006.01) |
| *H01L 25/16* | (2023.01) |
| *H10D 86/01* | (2025.01) |
| *H10D 86/40* | (2025.01) |
| H10H 20/825 | (2025.01) |
| H10H 20/857 | (2025.01) |

(52) U.S. Cl.
CPC ............. *H10D 86/60* (2025.01); *H01L 24/24* (2013.01); *H01L 24/25* (2013.01); *H01L 25/167* (2013.01); *H10D 86/021* (2025.01); *H10D 86/451* (2025.01); *H01L 2224/24051* (2013.01); *H01L 2224/24147* (2013.01); *H01L 2224/25175* (2013.01); *H10H 20/8252* (2025.01); *H10H 20/857* (2025.01)

(58) Field of Classification Search
CPC .... H10D 86/60; H10D 86/021; H10D 86/451; H10D 86/441; H10H 20/8252; H10H 20/857; H10H 20/819; H10H 20/84; H10H 20/8513; H10H 20/882; H10H 29/142
See application file for complete search history.

(56) References Cited

U.S. PATENT DOCUMENTS

| | | | |
|---|---|---|---|
| 7,982,812 B2 | 7/2011 | Rho et al. | |
| 9,412,801 B2* | 8/2016 | Choi | ............... H10K 59/80522 |
| 2017/0278912 A1* | 9/2017 | Kim | ................... H10K 59/8722 |
| 2021/0332256 A1* | 10/2021 | Sim | ........................ H10K 50/11 |

FOREIGN PATENT DOCUMENTS

KR        10-1376755 B1      3/2014

* cited by examiner

*Primary Examiner* — Syed I Gheyas
(74) *Attorney, Agent, or Firm* — Womble Bond Dickinson (US) LLP

(57) ABSTRACT

A display device includes: a substrate having an emission area and a non-emission area; a first bank in the non-emission area of the substrate and having an opening; electrodes on the first bank and spaced apart from each other; a second bank on the electrodes; and light emitting elements on the second bank between the electrodes. The second bank has a first area overlapping the light emitting elements and a second area in the opening in the first bank.

20 Claims, 28 Drawing Sheets

FIG. 13
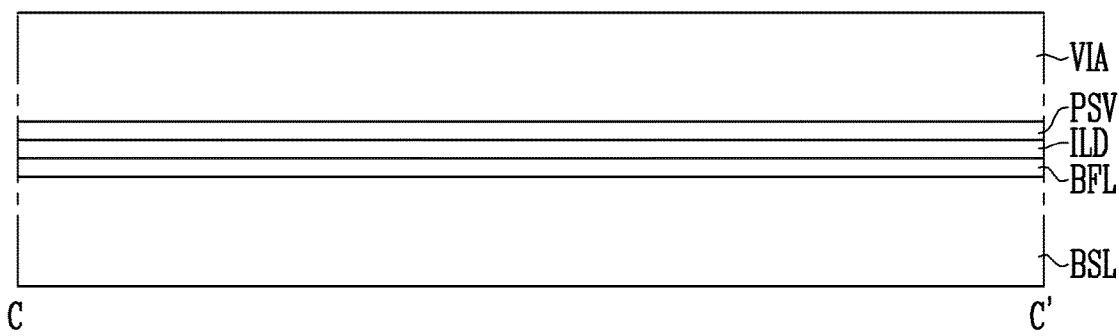
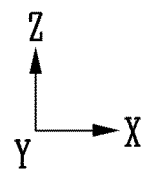

DISPLAY DEVICE AND METHOD OF FABRICATING THE SAME

CROSS-REFERENCE TO RELATED APPLICATION

The application claims priority to and the benefit of Korean patent application number 10-2021-0159623, filed on Nov. 18, 2021, the entire disclosure of which is incorporated herein in its entirety by reference.

BACKGROUND

1. Field

Aspects of embodiments of the present disclosure relate to a display device and a method of fabricating the display device.

2. Description of Related Art

Recently, as interest in information display increases, research and development regarding display devices has been continuously conducted.

SUMMARY

Various embodiments of the present disclosure are directed to a display device having enhanced light output efficiency and alignment of light emitting elements, and a method of fabricating the display device.

Aspects and features of the present disclosure are not limited to those described above, and those skilled in the art will clearly understand other aspects and features from the following description and accompanying claims.

According to an embodiment, a display device includes: a substrate having an emission area and a non-emission area; a first bank in the non-emission area of the substrate and having an opening; electrodes on the first bank and spaced apart from each other; a second bank on the electrodes; and light emitting elements on the second bank between the electrodes. The second bank has a first area overlapping the light emitting elements and a second area in the opening in the first bank.

A thickness of the second area of the second bank may be greater than a thickness of the first area of the second bank.

A thickness of the second area of the second bank may be identical as a thickness of the first bank.

The electrodes may extend from the opening in the first bank.

The display device may further include signal lines on the substrate, and the electrodes may be electrically connected to the signal lines through a contact opening.

The second area of the second bank may overlap the contact opening.

The display device may further include an insulating layer on the electrodes.

The display device may further include connection electrodes on the insulating layer and may be electrically connected to the light emitting elements.

The connection electrodes may be electrically connected to the electrodes through a contact opening passing through the insulating layer.

The second bank may be between the electrodes and the insulating layer.

According to an embodiment, a method of fabricating a display device includes: forming a first bank having an opening in a non-emission area of a substrate; forming, on the first bank, electrodes spaced apart from each other; simultaneously forming a first area of a second bank on the electrodes and a second area of the second bank in the opening in the first bank; and providing light emitting elements to the first area of the second bank.

A thickness of the second area of the second bank may be greater than a thickness of the first area of the second bank.

A thickness of the second area of the second bank may be identical as a thickness of the first bank.

The electrodes may extend from the opening in the first bank.

The method may further include: forming an insulating layer on the electrodes; and forming connection electrodes on the light emitting elements.

The connection electrodes may be electrically connected to the electrodes through a contact opening passing through the insulating layer.

The method may further include surface-treating the insulating layer on the first area of the second bank.

The light emitting elements may be on the insulating layer.

The first bank and the second bank may be formed of an identical material.

The first bank and the second bank may be formed of different materials.

Details of various embodiments are included in the detailed description and drawings.

BRIEF DESCRIPTION OF THE DRAWINGS

FIGS. 10 to 29 are plan views and sectional views of steps of a method of fabricating the display device in accordance with an embodiment.

DETAILED DESCRIPTION

Figure 1:
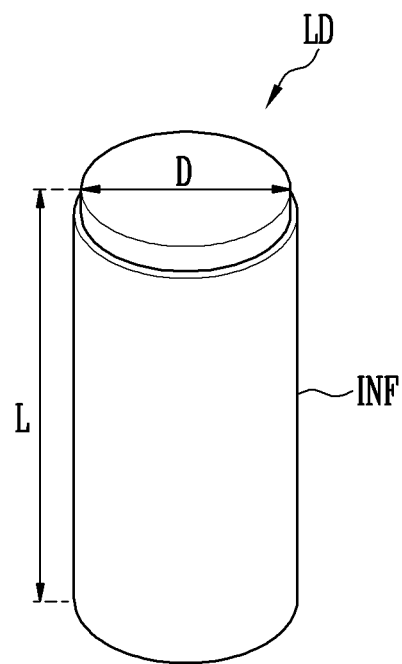
FIG. 1 is a perspective view of a light emitting element in accordance with an embodiment.

Aspects and features of the present disclosure, and methods for achieving the same, will be described with reference to embodiments, described in detail together with the accompanying drawings. The present disclosure is not limited to the following embodiments, and various modifications are possible. These embodiments are provided so that this disclosure will be thorough and complete and will fully convey the concept of the disclosure to those skilled in the art, and the present disclosure will only be defined by the appended claims.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

The terminology used herein is for the purpose of describing particular embodiments and is not intended to be limiting of the present disclosure. In this specification, the terms of a singular form may include plural forms unless specifically mentioned. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Furthermore, the term "coupling" or "connection," and variations thereof, may comprehensively refer to physical and/or electrical coupling or connection. In addition, the term "coupling" or "connection" may comprehensively refer to direct or indirect coupling or connection and integral or non-integral coupling or connection.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure.

Hereinafter, embodiments of the present disclosure will be described in detail with reference to the accompanying drawings.

Figure 2:
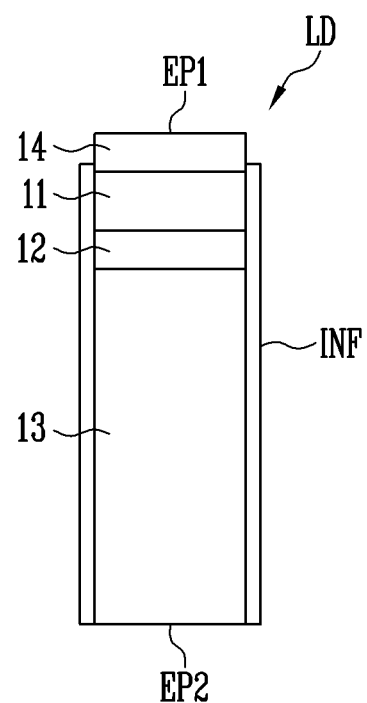
FIG. 2 is a sectional view of the light emitting element shown in FIG. 1.

FIG. 1 is a perspective view of a light emitting element in accordance with an embodiment, and FIG. 2 is a sectional view of the light emitting element shown in FIG. 1. Although FIGS. 1 and 2 illustrate a column-type light emitting element LD, the type and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be provided in the form (or shape) of a column extending in one direction. The light emitting element LD may have a first end EP1 and a second end EP2. One of the first and second semiconductor layers 11 and 13 may be disposed on the first end EP1 of the light emitting element LD, and the other one of the first and second semiconductor layers 11 and 13 may be disposed on the second end EP2 of the light emitting element LD. For example, the first semiconductor layer 11 may be disposed on the first end EP1 of the light emitting element LD, and the second semiconductor layer 13 may be disposed on the second end EP2 of the light emitting element LD.

In an embodiment, the light emitting element LD may be a light emitting element fabricated in a column shape through an etching scheme (or etching process) or the like. In the present specification, the term "column-type" includes a rod-like shape and a bar-like shape, such as a cylindrical shape and a prismatic shape having an aspect ratio greater than 1, but the cross-sectional shape thereof is not limited.

The light emitting element LD may have a small size corresponding to a range from the nanometer scale to the micrometer scale. For example, each light emitting element LD may have a diameter D (or a width) and/or a length L ranging from the nanometer scale to the micrometer scale. However, the size of the light emitting element LD is not limited thereto, and the size of the light emitting element LD may be changed in various ways depending on design conditions of various devices, such as a display device, using a light emitting device with the light emitting element LD as a light source.

The first semiconductor layer 11 may be a first conductive semiconductor layer. For example, the first semiconductor layer 11 may include a p-type semiconductor layer. The first semiconductor layer 11 may include a p-type semiconductor layer, which includes any one semiconductor material of InAlGaN, GaN, AlGaN, InGaN, or AlN, and is doped with a first conductive dopant, such as Mg. However, the material for forming the first semiconductor layer 11 is not limited thereto, and the first semiconductor layer 11 may be formed of various other suitable materials.

The active layer 12 may be disposed between the first semiconductor layer 11 and the second semiconductor layer 13. The active layer 12 may include any one structure of a single well structure, a multi-well structure, a single-quantum well structure, a multi-quantum well (MQW) structure, a quantum dot structure, and a quantum line structure, but the present disclosure is not limited thereto. The active layer 12 may include GaN, InGaN, InAlGaN, AlGaN, or AlN. In addition, various other suitable materials may be used to form the active layer 12.

If a voltage equal to or greater than a threshold voltage is applied between the opposite ends EP1 and EP2 of the light emitting element LD, the light emitting element LD may emit light by the coupling of electron-hole pairs in the active layer 12. Because light emission of the light emitting element LD can be controlled based on the foregoing principle, the light emitting element LD may be used as a light source of various light emitting devices as well as a pixel of the display device.

The second semiconductor layer 13 may be disposed on the active layer 12 and may include a semiconductor layer having a type different from that of the first semiconductor layer 11. The second semiconductor layer 13 may include an n-type semiconductor layer. For example, the second semiconductor layer 13 may include an n-type semiconductor layer, which includes any one semiconductor material of InAlGaN, GaN, AlGaN, InGaN, and AlN, and is doped with a second conductive dopant, such as Si, Ge, or Sn. However, the material for forming the second semiconductor layer 13 is not limited thereto, and the second semiconductor layer 13 may be formed of various other suitable materials.

The electrode layer 14 may be disposed at the first end EP1 and/or the second end EP2 of the light emitting element LD. Although FIG. 2 illustrates an embodiment in which the electrode layer 14 is formed on the first semiconductor layer 11, the present disclosure is not limited thereto. For example, a separate electrode layer may be further disposed on the second semiconductor layer 13.

The electrode layer 14 may include transparent metal or transparent metal oxide. For example, the electrode layer 14 may include at least one of indium tin oxide (ITO), indium zinc oxide (IZO), and zinc tin oxide (ZTO), but the present disclosure is not limited thereto. As such, when the electrode layer 14 is formed of transparent metal or transparent metal oxide, light generated from the active layer 12 of the light emitting element LD may be emitted from the light emitting element LD through the electrode layer 14.

An insulating layer INF may be provided on a surface of the light emitting element LD. The insulating layer INF may be directly disposed on a surface (e.g., a peripheral surface) of the first semiconductor layer 11, a surface of the active layer 12, a surface of the second semiconductor layer 13, and/or a surface of the electrode layer 14. The insulating layer INF may allow the first and second ends EP1 and EP2 of the light emitting element LD that have different polarities to be exposed. In an embodiment, the insulating layer INF may allow a sidewall of the electrode layer 14 and/or the second semiconductor layer 13 disposed adjacent to the first and second ends EP1 and EP2 of the light emitting element LD to be exposed.

The insulating layer INF may prevent the active layer 12 from short-circuiting due to contacting conductive material other than the first and second semiconductor layers 11 and 13. Furthermore, the insulating layer INF may reduce or minimize a surface defect of the light emitting elements LD, thus enhancing the lifetime and emission efficiency of the light emitting elements LD.

The insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium dioxide ($TiO_x$). For example, the insulating layer INF may have a double layer structure, and respective layers that form the double layer structure may include different materials. For example, the insulating layer INF may have a double layer structure formed of aluminum oxide ($AlO_x$) and silicon oxide ($SiO_x$), but the present disclosure is not limited thereto. In an embodiment, the insulating layer INF may be omitted.

A light emitting device including the light emitting element LD described above may be used not only in a display device but also in various devices which utilize a light source. For example, light emitting elements LD may be disposed in each pixel of a display panel so that the light emitting elements LD may be used as a light source of the pixel. However, the application field of the light emitting element LD is not limited to the above-mentioned examples. For example, the light emitting element LD may also be used in other types of devices, such as a lighting device, which utilize a light source.

Figure 3:
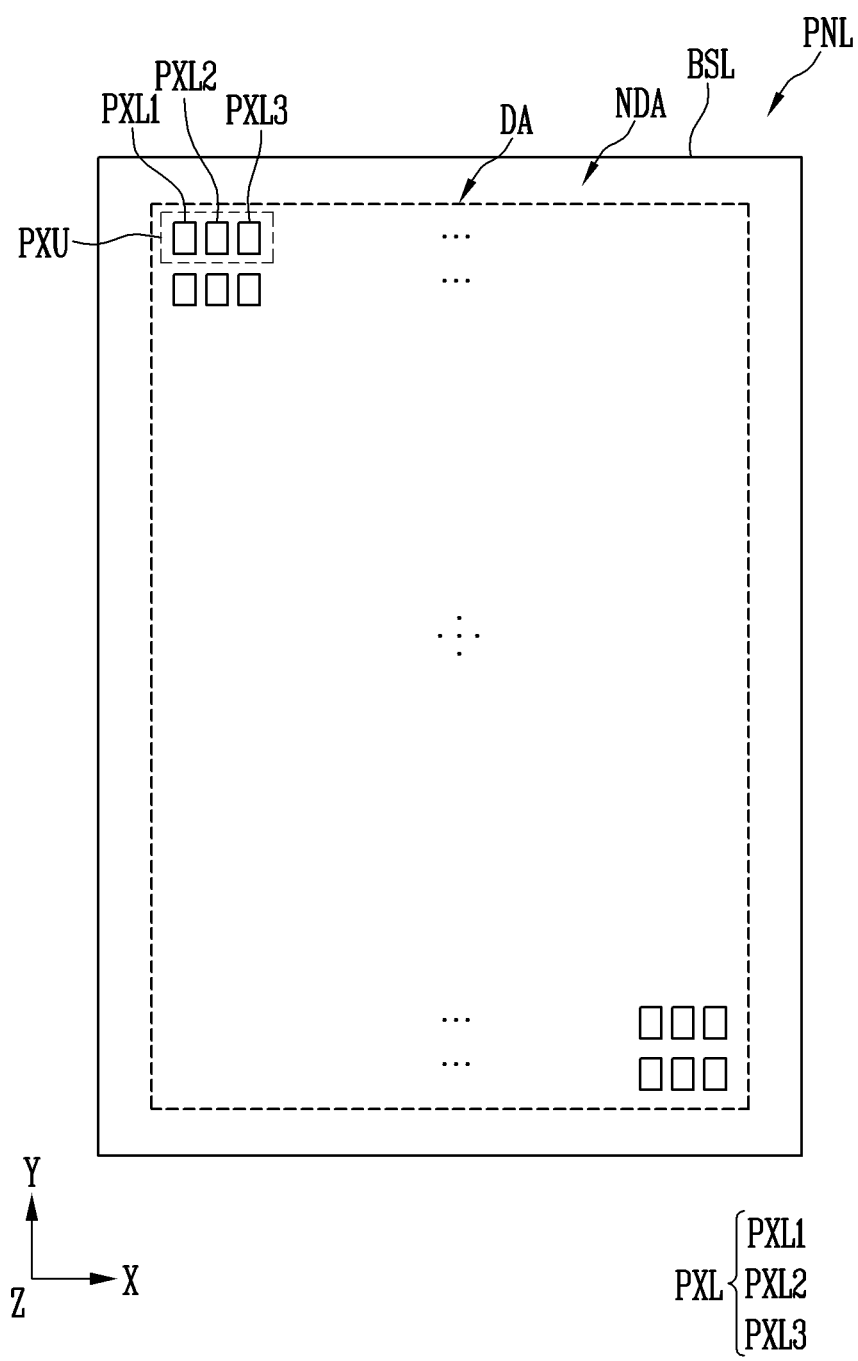
FIG. 3 is a plan view off a display device in accordance with an embodiment.

FIG. 3 is a plan view illustrating a display device in accordance with an embodiment.

FIG. 3 illustrates a display device, particularly, a display panel PNL provided in the display device, as an example of an electronic device which may use, as a light source, the light emitting element LD described in above with reference to FIGS. 1 and 2.

For the sake of explanation, FIG. 3 simply (or schematically) illustrates the structure of the display panel PNL in accordance with an embodiment with a focus on a display area DA thereof. In some embodiments, at least one driving circuit (e.g., at least one of a scan driver and a data driver), lines, and/or pads may be further provided on the display panel PNL.

Referring to FIG. 3, the display panel PNL and the base layer BSL for forming the display panel PNL may have a display area DA for displaying an image and a non-display area NDA other than the display area DA. The display area DA may form a screen on which an image is displayed. The non-display area NDA may be an area other than the display area DA (e.g., an area where an image is not displayed).

A pixel unit PXU may be disposed in the display area DA. The pixel unit PXU may include a first pixel PXL1, a second pixel PXL2, and/or a third pixel PXL3. Hereinafter, the term "pixel PXL" or "pixels PXL" will be used to arbitrarily designate any one pixel of the first pixel PXL1, the second pixel PXL2, and the third pixel PXL3, or collectively designate two or more kinds of pixels.

The pixels PXL may be regularly arranged according to a stripe or PENTILE® (a registered trademark of Samsung Display Co., Ltd.), or diamond, arrangement structure. The arrangement structure of the pixels PXL is not limited thereto, and the pixels PXL may be arranged in the display area DA in various structures and/or schemes.

In an embodiment, two or more kinds of pixels PXL, which emit different color light from each other, may be disposed in the display area DA. For example, first pixels PXL1 configured to emit a first color of light, second pixels PXL2 configured to emit a second color of light, and third pixels PXL3 configured to emit a third color of light may be arranged in the display area DA. At least one first pixel PXL1, at least one second pixel PXL2, and at least one third pixel PXL3 that are disposed adjacent to each other may form one pixel unit PXU, which may emit various colors of light. For example, each of the first to third pixels PXL1, PXL2, and PXL3 may be a pixel configured to emit a color of light (e.g., a predetermined color of light). In an embodiment, the first pixel PXL1 may be a red pixel configured to emit red light, a second pixel PXL2 may be a green pixel configured to emit green light, and a third pixel PXL3 may be a blue light configured to emit blue light. However, the present disclosure is not limited thereto.

In an embodiment, the first pixel PXL1, the second pixel PXL2, and the third pixel PXL3 may respectively include light emitting elements configured to emit the same color of light, and color conversion layers and/or color filter layers pertaining to different colors may be disposed on the respective light emitting elements so that the pixels may respectively emit the first color of light, the second color of light, and the third color of light. In an embodiment, the first pixel PXL1, the second pixel PXL2, and the third pixel PXL3 may include, as light sources, a light emitting element related to the first color, a light emitting element related to the second color, and a light emitting element related to the third color, so that the pixels may respectively emit the first color of light, the second color of light, and the third color of light. However, the colors, the types, and/or the number of pixels PXL that form each pixel unit PXU are not particularly limited. In other words, the color of light to be emitted from each pixel PXL may be changed in various suitable ways.

The pixel PXL may include at least one light source, which is driven by a control signal (e.g., a scan signal and a data signal) and/or a power supply (e.g., a first power supply and a second power supply). In an embodiment, the light source may include at least one light emitting element LD in accordance with any one of the embodiments described with respect to FIGS. 1 and 2, such as a subminiature column-type light emitting elements LD having a small size corresponding to a range from the nanometer scale to the micrometer scale. However, the present disclosure is not limited thereto, and different types of light emitting elements LD may be used as a light source of the pixel PXL.

In an embodiment, each pixel PXL may be formed as an active pixel. However, the types, structures, and/or driving schemes of the pixels PXL applicable to the display device are not particularly limited. For example, each pixel PXL may be formed as a pixel for passive or active light emitting display devices, which have various structures and/or may be operated according to various driving schemes.

Figure 4:
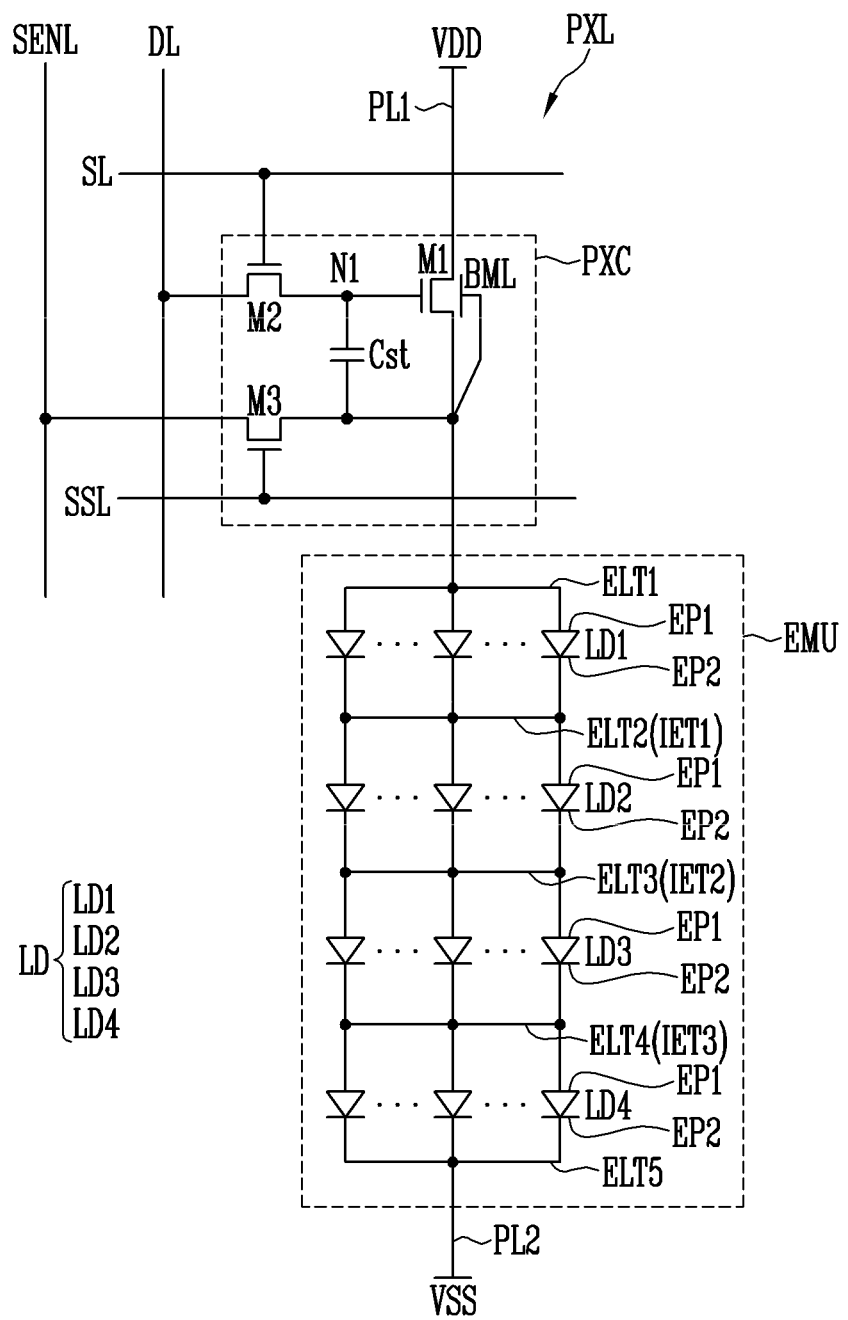
FIG. 4 is a circuit diagram of a pixel in accordance with an embodiment.

FIG. 4 is a circuit diagram illustrating a pixel in accordance with an embodiment.

The pixel PXL illustrated in FIG. 4 may be any one of the first pixel PXL1, the second pixel PXL2, and the third pixel PXL3 that are provided on the display panel PNL shown in FIG. 3. The first pixel PXL1, the second pixel PXL2, and the third pixel PXL3 may have a substantially identical or similar structure.

Referring to FIG. 4, each pixel PXL may include an emission circuit EMU configured to generate light having luminance corresponding to a data signal and a pixel circuit PXC configured to drive the emission circuit EMU.

The pixel circuit PXC may be connected between the first power supply VDD and the emission circuit EMU. Furthermore, the pixel circuit PXC may be connected to a scan line SL and a data line DL of the corresponding pixel PXL and may control the operation of the emission circuit EMU in response to a scan signal and a data signal supplied from the scan line SL and the data line DL, respectively. Furthermore, the pixel circuit PXC may be selectively further connected to a sensing signal line SSL and a sensing line SENL.

The pixel circuit PXC may include at least one transistor and at least one capacitor. For example, the pixel circuit PXC may include a first transistor M1, a second transistor M2, a third transistor M3, and a storage capacitor Cst.

The first transistor M1 may be connected between the first power supply VDD and a first connection electrode ELT1. A gate electrode of the first transistor M1 may be connected to the first node N1. The first transistor M1 may control a driving current to be supplied to the emission circuit EMU in response to a voltage at the first node N1. For example, the first transistor M1 may be a driving transistor configured to control the driving current of (or applied to) the pixel PXL.

Figure 7:
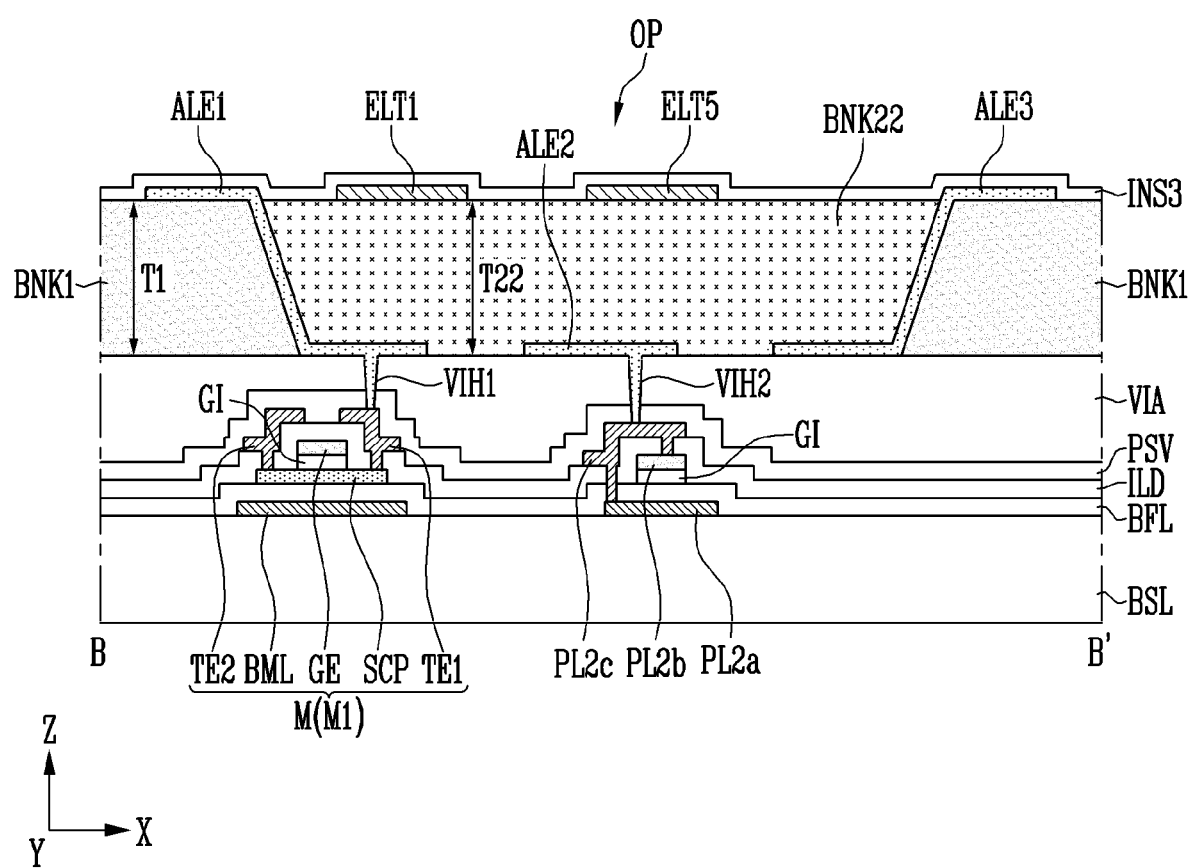
FIG. 7 is a sectional view taken along the line B-B' of FIG. 5.

In an embodiment, the first transistor M1 may selectively include a bottom conductive layer BML (referred also to as "bottom electrode", "back gate electrode," or "bottom light shielding layer") (see, e.g., FIG. 7). The gate electrode of the first transistor M1 and the bottom conductive layer BML may overlap each other with an insulating layer interposed therebetween. In an embodiment, the bottom conductive layer BML may be connected to one electrode of the first transistor M1, such as a source or drain electrode of the first transistor M1.

In an embodiment in which the first transistor M1 includes the bottom conductive layer BML, a back-biasing technique (or a sync technique) may be used. The back-biasing technique is a technique of shifting a threshold voltage of the first transistor M1 in a negative direction or a positive direction by applying a back-biasing voltage to the bottom conductive layer BML of the first transistor M1 when the pixel PXL is driven. For example, a source-sync technique may be used by connecting the bottom conductive layer BML to the source electrode of the first transistor M1 so that the threshold voltage of the first transistor M1 may be shifted in the negative direction or the positive direction. When the bottom conductive layer BML is disposed under a semiconductor pattern that forms a channel of the first transistor M1, the bottom conductive layer BML may act as a light shielding pattern and may stabilize operating characteristics of the first transistor M1. However, the function and/or application scheme of the bottom conductive layer BML is not limited thereto.

The second transistor M2 may be connected between the data line DL and the first node N1. A gate electrode of the second transistor M2 may be connected to the scan line SL. When a scan signal having a gate-on voltage (e.g., a high-level voltage) is supplied from the scan line SL, the second transistor M2 may be turned on to connect the data line DL with the first node N1.

During each frame period, a data signal of a corresponding frame may be supplied to the data line DL, and the data signal may be transmitted to the first node N1 through the second transistor M2 when it is turned on during a period in which the scan signal having the gate-on voltage is supplied to the scan line SL. In other words, the second transistor M2 may be a switching transistor configured to transmit each data signal to the interior of the pixel PXL.

One electrode of the storage capacitor Cst may be connected to the first node N1, and the other electrode thereof may be connected to a second electrode of the first transistor M1. The storage capacitor Cst may be charged with a voltage corresponding to a data signal to be supplied to the first node N1 during each frame period.

The third transistor M3 may be connected between the first connection electrode ELT1 (or the second electrode of the first transistor M1) and the sensing line SENL. A gate electrode of the third transistor M3 may be connected to the sensing signal line SSL. The third transistor M3 may transmit a voltage value applied to the first connection electrode ELT1 to the sensing line SENL in response to a sensing signal supplied to the sensing signal line SSL. The voltage value transmitted through the sensing line SENL may be provided to an external circuit (e.g., a timing controller). The external circuit may extract information about characteristics of each pixel PXL (e.g., a threshold voltage of the first transistor M1, etc.) based on the provided (or extracted) voltage value. The extracted characteristic information may be used to convert (or modify) image data to compensate for a deviation in characteristics between the pixels PXL.

Although FIG. 4 illustrates an embodiment in which all of the transistors included in the pixel circuit PXC are formed of n-type transistors, the present disclosure is not limited thereto. For example, at least one of the first, second, and third transistors M1, M2, and M3 may be a p-type transistor.

The structure and driving scheme of the pixel PXL may be changed in various suitable ways. For example, the pixel circuit PXC may not only be formed of the pixel circuit according to the embodiment illustrated in FIG. 4 but may be formed of a pixel circuit which may have various suitable structures and/or may be operated according to various suitable driving schemes.

For example, in one embodiment, the pixel circuit PXC may omit the third transistor M3. Furthermore, the pixel circuit PXC may further include other circuit elements, such as a compensation transistor configured to compensate for the threshold voltage of the first transistor M1, an initialization transistor configured to initialize the voltage of the first node N1 and/or the first connection electrode ELT1, an emission control transistor configured to control a period in which driving current is supplied to the emission circuit EMU, and/or a boosting capacitor configured to boost the voltage at the first node N1.

The emission circuit EMU may include one light emitting element LD or a plurality of light emitting elements LD connected between the first power supply VDD and the second power supply VSS.

For example, the emission circuit EMU may include a first connection electrode ELT1 connected to the first power supply VDD via the pixel circuit PXC and the first power line PL1, a fifth connection electrode ELT5 connected to the second power supply VSS via the second power line PL2, and a plurality of light emitting elements LD connected between the first and fifth connection electrodes ELT1 and ELT5.

The first power supply VDD and the second power supply VSS may have different potentials to allow the light emitting elements LD to emit light. For example, the first power supply VDD may be set as a high-potential power supply, and the second power supply VSS may be set as a low-potential power supply.

In an embodiment, the emission circuit EMU may include at least one serial stage. Each serial stage may include a pair of electrodes (e.g., two electrodes) and at least one light emitting element LD connected in a forward direction between the pair of electrodes. Here, the number of serial stages that form the emission circuit EMU and the number of light emitting elements LD that form each serial stage are not particularly limited. For example, the numbers of light emitting elements LD that form the respective serial stages may be identical to or different from each other. The number of light emitting elements LD in each serial stage is not particularly limited.

For example, the emission circuit EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include a first connection electrode ELT1, a second connection electrode ELT2, and at least one first light emitting element LD1 connected between the first and second connection electrodes ELT1 and ELT2. Each first light emitting element LD1 may be connected in the forward direction between the first and second connection electrodes ELT1 and ELT2. For example, a first end EP1 of the first light emitting element LD1 may be connected to the first connection electrode ELT1, and a second end EP2 of the first light emitting element LD1 may be connected to the second connection electrode ELT2.

The second serial stage may include the second connection electrode ELT2, a third connection electrode ELT3, and at least one second light emitting element LD2 connected between the second and third connection electrodes ELT2 and ELT3. Each second light emitting element LD2 may be connected in the forward direction between the second and third connection electrodes ELT2 and ELT3. For example, a first end EP1 of the second light emitting element LD2 may be connected to the second connection electrode ELT2, and a second end EP2 of the second light emitting element LD2 may be connected to the third connection electrode ELT3.

The third serial stage may include the third connection electrode ELT3, a fourth connection electrode ELT4, and at least one third light emitting element LD3 connected between the third and fourth connection electrodes ELT3 and ELT4. Each third light emitting element LD3 may be connected in the forward direction between the third and fourth connection electrodes ELT3 and ELT4. For example, a first end EP1 of the third light emitting element LD3 may be connected to the third connection electrode ELT3, and a second end EP2 of the third light emitting element LD3 may be connected to the fourth connection electrode ELT4.

The fourth serial stage may include the fourth connection electrode ELT4, a fifth connection electrode ELT5, and at least one fourth light emitting element LD4 connected between the fourth and fifth connection electrodes ELT4 and ELT5. Each fourth light emitting element LD4 may be connected in the forward direction between the fourth and fifth connection electrodes ELT4 and ELT5. For example, a first end EP1 of the fourth light emitting element LD4 may be connected to the fourth connection electrode ELT4, and a second end EP2 of the fourth light emitting element LD4 may be connected to the fifth connection electrode ELT5.

The first electrode of the emission circuit EMU (e.g., the first connection electrode ELT1 or the electrode first connected to the pixel circuit PXC) may be an anode electrode of the emission circuit EMU. The last electrode of the emission circuit EMU (e.g., the fifth connection electrode ELT5 or the electrode connected to the second power line PL2) may be a cathode electrode of the emission circuit EMU.

The other electrodes of the emission circuit EMU (e.g., the second connection electrode ELT2, the third connection electrode ELT3, and/or the fourth connection electrode ELT4) may each form an intermediate electrode. For example, the second connection electrode ELT2 may form a first intermediate electrode IET1. The third connection electrode ELT3 may form a second intermediate electrode IET2. The fourth connection electrode ELT4 may form a third intermediate electrode IET3.

In an embodiment in which the light emitting elements LD are connected in a serial/parallel structure, power efficiency may be enhanced compared to an embodiment in which the same number of light emitting elements LD are connected only in parallel to each other. Furthermore, in the pixel PXL in which the light emitting elements LD are connected in the serial/parallel structure, even if a short-circuit defect or the like occurs in some serial stages, sufficient luminance can be expressed by the light emitting elements LD of the other serial stages, thereby reducing the probability of occurrence of a black spot defect in the pixel PXL. However, the present disclosure is not limited thereto. The emission circuit EMU may be formed by connecting the light emitting elements LD only in series. In yet other embodiments, the emission circuit EMU may be formed by connecting the light emitting elements LD only in parallel.

Each of the light emitting elements LD may have a first end EP1 (e.g., a p-type end) connected to the first power supply VDD via at least one electrode (e.g., the first connection electrode ELT1), the pixel circuit PXC, and/or the first power line PL1, etc. and a second end EP2 (e.g., an n-type end) connected to the second power supply VSS via at least another electrode (e.g., the fifth connection electrode ELT5), and the second power line PL2, etc. For example, the light emitting elements LD may be connected in the forward direction between the first power supply VDD and the second power supply VSS. The light emitting elements LD connected in the forward direction may form valid (or operative) light sources of the emission circuit EMU.

The light emitting elements LD may emit, when driving current is supplied thereto through the corresponding pixel circuit PXC, light having luminance corresponding to the driving current. For example, during each frame period, the pixel circuit PXC may supply driving current corresponding to a gray scale value to be expressed in a corresponding frame to the light emitter EMU. Hence, the light emitting elements LD may emit light having luminance corresponding to the driving current so that the emission circuit EMU may express the luminance corresponding to the driving current.

Figure 5:
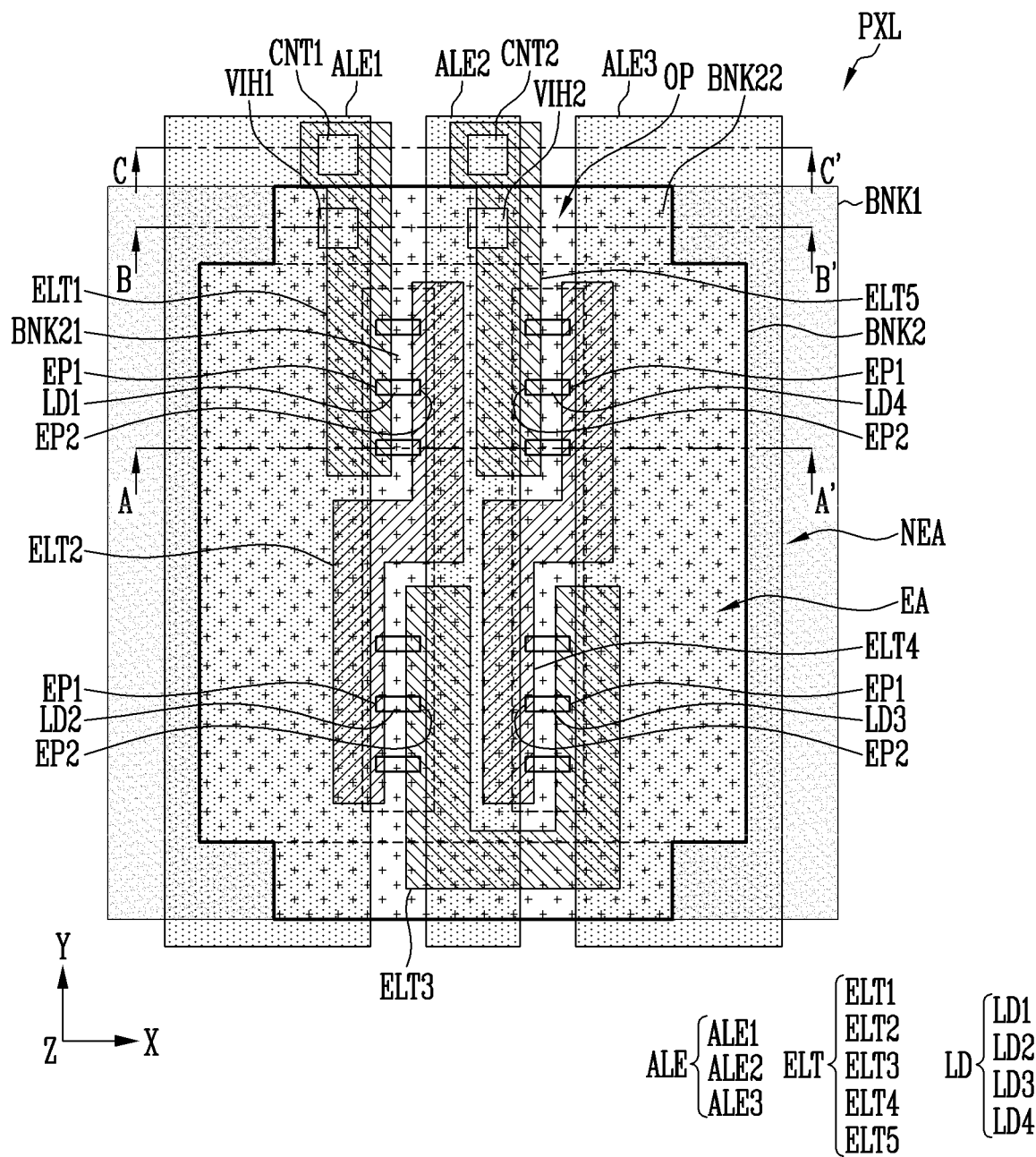
FIG. 5 is a plan view of a pixel in accordance with an embodiment.
Figure 6:
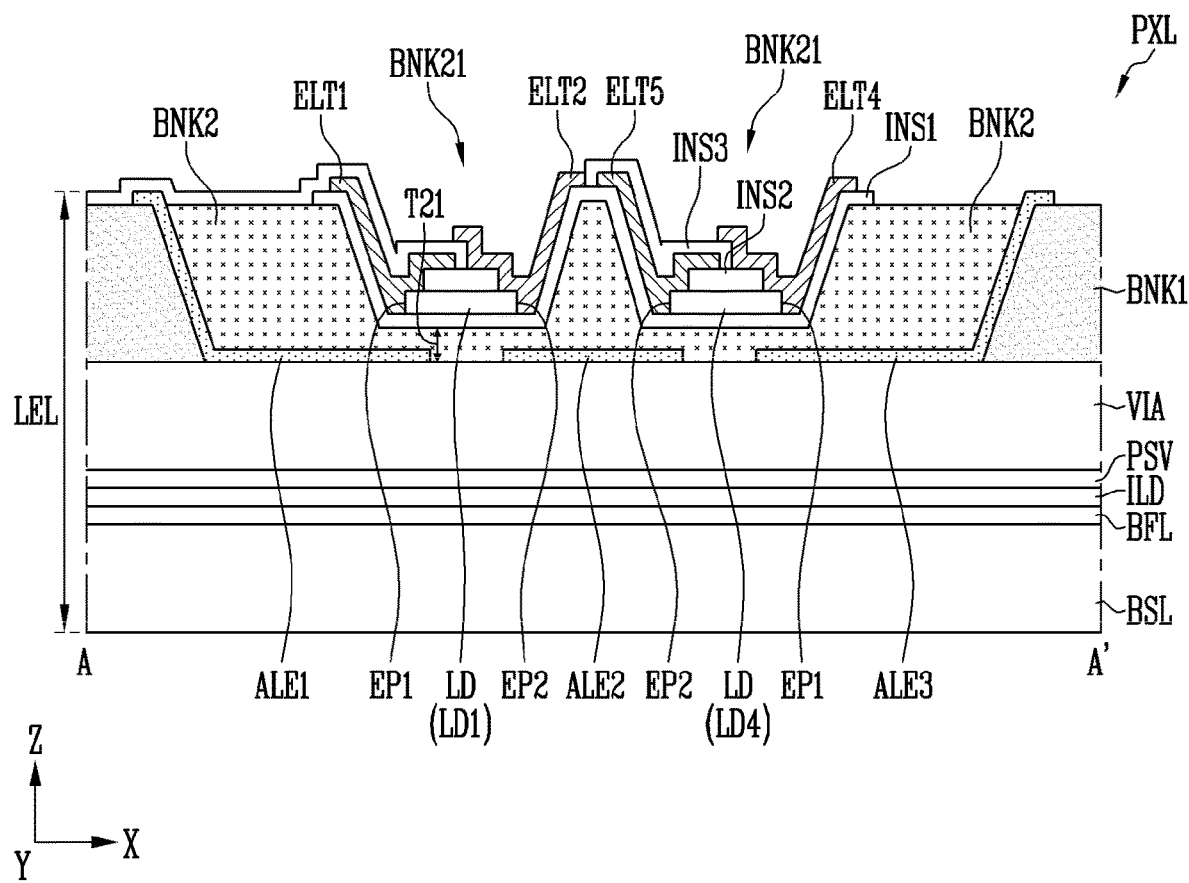
FIG. 6 is a sectional view taken along the line A-A' of FIG. 5.
Figure 8:
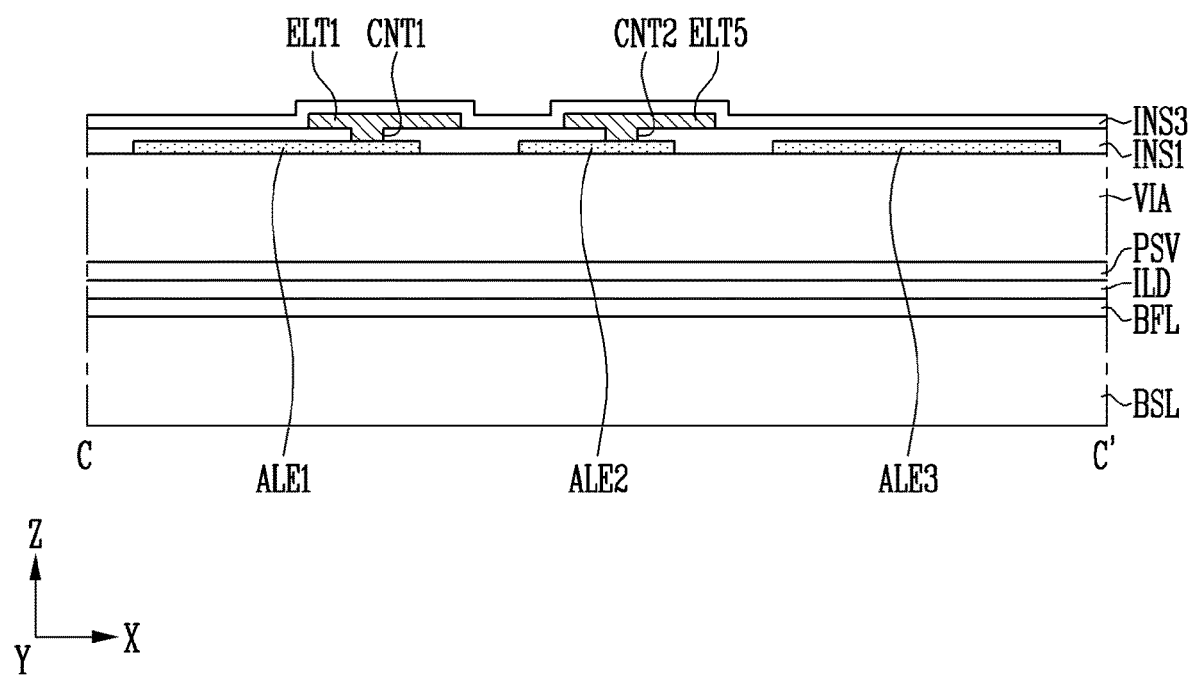
FIG. 8 is a sectional view taken along the line C-C' of FIG. 5.

FIG. 5 is a plan view of a pixel in accordance with an embodiment, FIG. 6 is a sectional view taken along the line A-A' of FIG. 5, FIG. 7 is a sectional view taken along the line B-B' of FIG. 5, and FIG. 8 is a sectional view taken along the line C-C' of FIG. 5.

The pixel PXL shown in FIG. 5 may be any one of the first to third pixels PXL1, PXL2, and PXL3 that form the pixel unit PXU shown in FIG. 3, and the first to third pixels PXL1, PXL2, and PXL3 may have substantially identical or similar structures. Although FIG. 5 illustrates an embodiment in which, as illustrated in FIG. 4, each pixel PXL includes light emitting elements LD arranged in four serial stages, the number of serial stages in the pixel PXL may be changed in various ways depending on embodiments.

Hereinafter, the term "light emitting element LD" or "light emitting elements LD" will be used to arbitrarily designate at least one light emitting element from among the first to fourth light emitting elements LD1, LD2, LD3, and LD4 or to collectively designate two or more kinds of light emitting elements. Furthermore, the term "electrode ALE" or "electrodes ALE" will be used to arbitrarily designate at least one of electrodes including the first to third electrodes ALE1, ALE2, and ALE3. The term "connection electrode ELT" or "connection electrode ELT" will be used to arbitrarily designate at least one of electrodes including the first to fifth connection electrodes ELT1, ELT2, ELT3, ELT4, and ELT5.

Referring to FIG. 5, each pixel PXL may have an emission area EA and a non-emission area NEA. The emission area EA may be an area including light emitting elements LD and that is able to (or configured to) emit light. The non-emission area NEA may be disposed to enclose (e.g., to extend around or surround in a plan view a periphery of) the emission area EMA. The non-emission area NEA may be an area where a first bank BNK1 enclosing the emission area EA is provided.

The pixel PXL may include the first bank BNK1, a second bank BNK2, electrodes ALE, light emitting elements LD, and/or connection electrodes ELT.

The first bank BNK1 may be provided in the non-emission area NEA and may be disposed to at least partially enclose (or extend around or surround in a plan view) the emission area EA. When the light emitting elements LD are supplied to each pixel PXL, the first bank BNK1 may act as a dam structure to define the emission area EA at where the light emitting elements LD are to be supplied. For example, because the emission area EA is defined by the first bank BNK1, a desired kind and/or amount of light emitting element ink can be supplied to the emission area EA.

The first bank BNK1 may have at least one opening OP. The opening OP in the first bank BNK1 may be a partially disconnected portion of the first bank BNK1. For example, the opening OP in the first bank BNK1 may provide space or a path through which lines, to be formed during a subsequent process, pass.

The first bank BNK1 may include at least one light shielding and/or reflective material. Therefore, light leakage between adjacent pixels PXL may be reduced or prevented. For example, the first bank BNK1 may include at least one black matrix material and/or color filter material. For instance, the bank BNK may be formed of a black opaque pattern that can block transmission of light.

The first bank BNK1 may include organic material, such as acrylic resin, epoxy resin, phenolic resin, polyamide resin, polyimide resin, polyester resin, polyphenylene sulfide resin, or benzocyclobutene (BCB). However, the present disclosure is not limited thereto, and the first bank BNK1 may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The second bank BNK2 may be disposed in the emission area EA and the non-emission area NEA. The second bank BNK2 may have at least one or more first areas BNK21m which is disposed in the emission area EA and overlaps light emitting elements LD, to be described below. The first areas BNK21 of the second bank BNK2 may provide space in which the light emitting elements LD can be provided and/or aligned. The first areas BNK21 of the second bank BNK2 may extend in a second direction (e.g., a Y-axis direction in FIG. 5) and may be spaced apart from each other in a first direction (e.g., an X-axis direction in FIG. 5).

Furthermore, the second bank BNK2 may have a second area BNK22 disposed in the opening OP in the first bank BNK1 in the non-emission area NEA. The second area BNK22 of the second bank BNK2 may be disposed in the opening OP in the first bank BNK1 and may connect otherwise disconnected parts of the first bank BNK1 to each other. Hence, a desired kind and/or amount of light emitting element ink may be supplied to the emission area EA enclosed by the first bank BNK1 and the second area BNK22 of the second bank BNK2.

The first area BNK21 and the second area BNK22 of the second bank BNK2 may be formed of the same material. For example, the first area BNK21 and the second area BNK22 of the second bank BNK2 may be integrally provided or formed. The first area BNK21 and the second area BNK22 of the second bank BNK2 may be concurrently (or simultaneously) formed through the same process, but the present disclosure is not limited thereto.

The second bank BNK2 may include organic material, such as acrylic resin, epoxy resin, phenolic resin, polyamide resin, polyimide resin, polyester resin, polyphenylene sulfide resin, or benzocyclobutene (BCB). However, the present disclosure is not limited thereto, and the second bank BNK2 may include various suitable inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Although the first bank BNK1 and the second bank BNK2 may be formed of the same material, the present disclosure is not limited thereto. In some embodiments, the first bank BNK1 and the second bank BNK2 are formed of different materials.

The electrodes ALE may be provided in at least the emission area EA. The electrodes ALE may extend in the second direction (e.g., the Y-axis direction in FIG. 5) and may be spaced apart from each other in the first direction (e.g., the X-axis direction in FIG. 5). At least some of the electrodes ALE may extend in the second direction (e.g., the Y-axis direction in FIG. 5) through the opening OP in the first bank BNK1. Hence, at least some of the electrodes ALE may extend to (or into) adjacent pixels PXL.

The first to third electrodes ALE1, ALE2, and ALE3 each may extend in the second direction (e.g., the Y-axis direction in FIG. 5) and may be spaced apart from each other in the first direction (e.g., the X-axis direction in FIG. 5) and successively disposed. Some of the electrodes ALE may be connected to the pixel circuit (e.g., the pixel circuit PXC shown in FIG. 4) and/or a power line (e.g., a predetermined power line) through openings (e.g., via holes) VIH1 and VIH2. For example, the first electrode ALE1 may be connected to the pixel circuit PXC and/or the first power line PL1 through the first opening (e.g., the first via hole) VIH1, and the second electrode ALE2 may be connected to the second power line PL2 through the second opening (e.g., the second via hole) VIH2.

In an embodiment, some of the electrodes ALE may be electrically connected to some of the connection electrodes ELT through contactors CNT1 and CNT2. For example, the first electrode ALE1 may be electrically connected to the first connection electrode ELT1 through a first contactor CNT1, and the second electrode ALE2 may be electrically connected to the fifth connection electrode ELT5 through a second contactor CNT2 (see, e.g., FIG. 8).

A pair of alignment electrodes ALE adjacent to each other may be supplied with different signals during the step of aligning the light emitting elements LD. For example, when the first to third electrodes ALE1, ALE2, and ALE3 are successively arranged in the first direction (the X-axis direction), the first electrode ALE1 and the second electrode ALE2 may be supplied with different alignment signals, and the second electrode ALE2 and the third electrode ALE3 may be supplied with different alignment signals.

The electrodes ALE may at least partially overlap the first bank BNK1. The electrodes ALE that overlap the first bank BNK1 each may have a shape corresponding to that of the first bank BNK1. For example, the electrodes ALE may include an inclined surface or curved surface corresponding to that of the first bank BNK1. In an embodiment in which the electrodes ALE include reflective material, light emitted from the light emitting elements LD may be reflected by the electrodes ALE formed on the first bank BNK1 and to be emitted in a frontal direction of the pixel PXL, (e.g., in a third direction (e.g., a Z-axis direction in FIG. 5)), so that light output efficiency of the display panel PNL is improved.

The light emitting elements LD may be aligned between a pair of electrodes ALE in each emission area EA. Furthermore, the light emitting elements LD each may be electrically connected between a pair of connection electrodes ELT.

The first light emitting element LD1 may be aligned between the first and second electrodes ALE1 and ALE2. The first light emitting element LD1 may be electrically connected between the first and second connection electrodes ELT1 and ELT2. For example, the first light emitting element LD1 may be aligned in first areas (e.g., upper end areas in FIG. 5) of the first and second electrodes ALE1 and ALE2. The first end EP1 of the first light emitting element LD1 may be electrically connected to the first connection electrode ELT1, and the second end EP2 of the first light emitting element LD1 may be electrically connected to the second connection electrode ELT2.

The second light emitting element LD2 may be aligned between the first and second electrodes ALE1 and ALE2. The second light emitting element LD2 may be electrically connected between the second and third connection electrodes ELT2 and ELT3. For example, the second light emitting element LD2 may be aligned in second areas (e.g., lower end areas in FIG. 5) of the first and second electrodes ALE1 and ALE2. The first end EP1 of the second light emitting element LD2 may be electrically connected to the second connection electrode ELT2, and the second end EP2 of the second light emitting element LD2 may be electrically connected to the third connection electrode ELT3.

The third light emitting element LD3 may be aligned between the second and third electrodes ALE2 and ALE3. The third light emitting element LD3 may be electrically connected between the third and fourth connection electrodes ELT3 and ELT4. For example, the third light emitting element LD3 may be aligned in second areas (e.g., lower end areas in FIG. 5) of the second and third electrodes ALE2 and ALE3. The first end EP1 of the third light emitting element LD3 may be electrically connected to the third connection electrode ELT3, and the second end EP2 of the third light emitting element LD3 may be electrically connected to the fourth connection electrode ELT4.

The fourth light emitting element LD4 may be aligned between the second and third electrodes ALE2 and ALE3. The fourth light emitting element LD4 may be electrically connected between the fourth and fifth connection electrodes ELT4 and ELT5. For example, the fourth light emitting element LD4 may be aligned in first areas (e.g., upper end areas in FIG. 5) of the second and third electrodes ALE2 and ALE3. The first end EP1 of the fourth light emitting element LD4 may be electrically connected to the fourth connection electrode ELT4, and the second end EP2 of the fourth light emitting element LD4 may be electrically connected to the fifth connection electrode ELT5.

For example, the first light emitting element LD1 may be disposed in a left upper end area of the emission area EA. The second light emitting element LD2 may be disposed in a left lower end area of the emission area EA. The third light emitting element LD3 may be disposed in a right lower end area of the emission area EA. The fourth light emitting element LD4 may be disposed in a right upper end area of the emission area EA. Here, the arrangement and/or connection structure of the light emitting elements LD may be changed in various suitable ways depending on the structure of the emission circuit EMU and/or the number of serial stages.

The connection electrodes ELT each may be provided in at least the emission area EA and may be disposed to overlap at least one electrode ALE and/or light emitting element LD. For example, the connection electrodes ELT may be provided on the electrodes ALE and/or the light emitting elements LD in such a way that each of the connection electrodes ELT overlaps the corresponding electrodes ALE and/or the corresponding light emitting elements LD such that the connection electrodes ELT may be electrically connected to the light emitting elements LD.

The first connection electrode ELT1 may be disposed on the first area (e.g., the upper end area in FIG. 5) of the first electrode ALE1 and the first ends EP1 of the first light emitting elements LD1 and, thus, electrically connected to the first ends EP1 of the first light emitting elements LD1.

The second connection electrode ELT2 may be disposed on the first area (e.g., the upper end area in FIG. 5) of the second electrode ALE2 and the second ends EP2 of the first light emitting elements LD1 and, thus, electrically connected to the second ends EP2 of the first light emitting elements LD1. Furthermore, the second connection electrode ELT2 may be disposed on the second area (e.g., the lower end area in FIG. 5) of the first electrode ALE1 and the first ends EP1 of the second light emitting elements LD2 and, thus, electrically connected to the first ends EP1 of the second light emitting elements LD2. For example, the second connection electrode ELT2 may electrically connect the second ends EP2 of the first light emitting elements LD1 and the first ends EP1 of the second light emitting elements LD2 to each other in the emission area EA. To this end, the second connection electrode ELT2 may have a curved (or bent) shape. For example, the third connection electrode ELT2 may have a bent or curved structure at a boundary between an area where at least one first light emitting element LD1 is disposed and an area where at least one second light emitting element LD2 is disposed.

The third connection electrode ELT3 may be disposed on the second area (e.g., the lower end area in FIG. 5) of the second electrode ALE2 and the second ends EP2 of the second light emitting elements LD2 and, thus, electrically connected to the second ends EP2 of the second light emitting elements LD2. Furthermore, the third connection electrode ELT3 may be disposed on the second area (e.g., the lower end area in FIG. 5) of the third electrode ALE3 and the first ends EP1 of the third light emitting elements LD3 and, thus, electrically connected to the first ends EP1 of the third light emitting elements LD3. For example, the third connection electrode ELT3 may electrically connect the second ends EP2 of the second light emitting elements LD2 and the first ends EP1 of the third light emitting elements LD3 to each other in the emission area EA. To this end, the third connection electrode ELT3 may have a curved (or bent or 'U') shape. For example, the third connection electrode ELT3 may have a bent or curved structure at a boundary between an area where at least one second light emitting element LD2 is disposed and an area where at least one third light emitting element LD3 is disposed.

The fourth connection electrode ELT4 may be disposed on the second area (e.g., the lower end area in FIG. 5) of the second electrode ALE2 and the second ends EP2 of the third light emitting elements LD3 and, thus, electrically connected to the second ends EP2 of the third light emitting elements LD3. Furthermore, the fourth connection electrode ELT4 may be disposed on the first area (e.g., the upper end area in FIG. 5) of the third electrode ALE3 and the first ends EP1 of the fourth light emitting elements LD4 and, thus, electrically connected to the first ends EP1 of the fourth light emitting elements LD4. For example, the fourth connection electrode ELT4 may electrically connect the second ends EP2 of the third light emitting elements LD3 and the first ends EP1 of the fourth light emitting elements LD4 to each other in the emission area EA. To this end, the fourth connection electrode ELT4 may have a curved (or bent) shape. For example, the fourth connection electrode ELT4 may have a bent or curved structure at a boundary between an area where at least one third light emitting element LD3 is disposed and an area where at least one fourth light emitting element LD4 is disposed.

The fifth connection electrode ELT5 may be disposed on the first area (e.g., the upper end area in FIG. 5) of the second electrode ALE2 and the second ends EP2 of the fourth light emitting elements LD4 and, thus, electrically connected to the second ends EP2 of the fourth light emitting elements LD4.

In this way, the light emitting elements LD aligned between the electrodes ALE may be connected in a desired form (or arrangement) by using the connection electrodes ELT. For example, the first light emitting elements LD1, the second light emitting elements LD2, the third light emitting elements LD3, and the fourth light emitting elements LD4 may be successively connected in series by using the connection electrodes ELT.

Hereinafter, a cross-sectional structure of the pixel PXL will be described in more detail with reference to FIGS. 6 and 7. FIG. 6 illustrates a light emitting element layer LEL of the pixel PXL, and FIG. 7 illustrates a first transistor M1 of various circuit elements that form the pixel circuit (see, e.g., PXC in FIG. 4). When there is no need to separately designate the first to third transistors M1, M2, and M3, the term "transistor M" will be comprehensively used. The structures of the transistors M and/or positions in layers thereof are not limited to those of the embodiment shown in FIG. 6 and may be changed in various ways depending on embodiments.

Referring to FIGS. 6 and 7, the light emitting element layer LEL for the pixels PXL in accordance with an embodiment may include circuit elements including transistors M disposed on the base layer BSL and various lines connected to the circuit elements. The first bank BNK1, the second bank BNK2, and the electrodes ALE, the light emitting elements LD, and/or connection electrodes ELT that form the emission circuit EMU may be disposed on the circuit elements.

The base layer BSL may form a base and may be formed of a rigid or flexible substrate or film. For example, the base layer BSL may be a rigid substrate made of glass or reinforced glass, a flexible substrate (or a thin film) formed of plastic or metal, or at least one insulating layer. The material and/or properties of the base layer BSL is not particularly limited. In an embodiment, the base layer BSL may be substantially transparent. The phrase "substantially transparent" may mean that light can pass through the substrate SUB at a reference transmissivity or more. In an embodiment, the base layer BSL may be translucent or opaque. Furthermore, the base layer BSL may include, in some embodiments, reflective material.

The bottom conductive layer BML and a first power conductive layer PL2a may be disposed on the base layer BSL. The bottom conductive layer BML and the first power conductive layer PL2a may be disposed on the same layer. For example, the bottom conductive layer BML and the first power conductive layer PL2a may be concurrently (or simultaneously) formed through the same process, but the present disclosure is not limited thereto. The first power conductive layer PL2a may form the second power line PL2 described with reference to, for example, FIG. 4, etc.

The bottom conductive layer BML and the first power conductive layer PL2a may each have a single layer or multilayer structure formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof.

A buffer layer BFL may be disposed on the bottom conductive layer BML and the first power conductive layer PL2a. The buffer layer BFL may prevent impurities from diffusing into a circuit element. The buffer layer BFL may be formed of a single layer or may be formed of multiple layers (e.g., at least two or more layers). In an embodiment in which the buffer layer BFL has a multilayer structure, the respective layers may be formed of the same material or different materials.

A semiconductor pattern SCP may be disposed on the buffer layer BFL. For example, each semiconductor pattern SCP may include a first area which contacts a first transistor electrode TE1, a second area which contacts a second transistor electrode TE2, and a channel area disposed between the first and second areas. In an embodiment, one of the first and second areas may be a source area, and the other one may be a drain area.

In an embodiment, the semiconductor pattern SCP may be formed of polysilicon, amorphous silicon, an oxide semiconductor, etc. The channel area of the semiconductor pattern SCP may be an intrinsic semiconductor, which is an undoped semiconductor pattern. Each of the first and second areas of the semiconductor pattern SCP may be a semiconductor doped with an impurity (e.g., a predetermined impurity).

A gate insulating layer GI may be disposed on the buffer layer BFL and the semiconductor pattern SCP. For example, the gate insulating layer GI may be disposed between the semiconductor pattern SCP and the gate electrode GE. Furthermore, the gate insulating layer GI may be disposed between the buffer layer BFL and a second power conductive layer PL2b. The gate insulating layer GI may be formed of a single layer or of multiple layers and may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE of the transistor M and the second power conductive layer PL2b may be disposed on the gate insulating layer GI. The gate electrode GE and the second power conductive layer PL2b may be disposed on the same layer. For example, the gate electrode GE and the second power conductive layer PL2b may be concurrently (or simultaneously) formed through the same process, but the present disclosure is not limited thereto. The gate electrode GE may be disposed on the gate insulating layer GI to overlap the semiconductor pattern SCP in the third direction DR3 (e.g., the Z-axis direction in FIG. 7). The second power conductive layer PL2b may be disposed on the gate insulating layer GI to overlap the first power conductive layer PL2a in the third direction DR3 (e.g., the Z-axis direction in FIG. 7). The second power conductive layer PL2b and the first power conductive layer PL2a may together form the second power line PL2 described with reference to, for example, FIG. 4, etc.

The gate electrode GE and the second power conductive layer PL2b may each have a single layer or a multilayer structure formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof. For example, the gate electrode GE and the second power conductive layer PL2b may each have a multilayer structure formed by successively (or repeatedly) stacking titanium (Ti), copper (Cu), and/or indium tin oxide (ITO).

An interlayer insulating layer ILD may be disposed on the gate electrode GE and the second power conductive layer PL2b. For example, the interlayer insulating layer ILD may be disposed between the gate electrode GE and the first and second transistor electrodes TE1 and TE2. Furthermore, the interlayer insulating layer ILD may be disposed between the second power conductive layer PL2b and a third power conductive layer PL2c.

The interlayer insulating layer ILD may be formed of a single layer or multiple layers and may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second transistor electrodes TE1 and TE2 of the transistor M and the third power conductive layer PL2c may be disposed on the interlayer insulating layer ILD. The first and second transistor electrodes TE1 and TE2 and the third power conductive layer PL2c may be formed of the same layer. For example, the first and second transistor electrodes TE1 and TE2 and the third power conductive layer PL2c may be concurrently (or simultaneously) formed through the same process, but the present disclosure is not limited thereto.

The first and second transistor electrodes TE1 and TE2 may be disposed to overlap the semiconductor pattern SCP in the third direction DR3 (e.g., the Z-axis direction in FIG. 7). The first and second transistor electrodes TE1 and TE2 may be electrically connected to the semiconductor pattern SCP. For example, the first transistor electrode TE1 may be electrically connected with the first area of the semiconductor pattern SCP through a contact opening (e.g., a contact hole) passing through the interlayer insulating layer ILD. Furthermore, the first transistor electrode TE1 may be electrically connected with the bottom conductive layer BML through a contact opening (e.g., a contact hole) passing through the interlayer insulating layer ILD and the buffer layer BFL. The second transistor electrode TE2 may be electrically connected with the second area of the semiconductor pattern SCP through a contact opening (e.g., a contact hole) passing through the interlayer insulating layer ILD. In an embodiment, any one of the first and second transistor electrodes TE1 and TE2 may be a source electrode, and the other one may be a drain electrode.

The third power conductive layer PL2c may be disposed to overlap the first power conductive layer PL2a and/or the second power conductive layer PL2b in the third direction (e.g., the Z-axis direction in FIG. 7). The third power conductive layer PL2c may be electrically connected to the first power conductive layer PL2a and/or the second power conductive layer PL2b. For example, the third power conductive layer PL2c may be electrically connected with the first power conductive layer PL2a through a contact opening (e.g., a contact hole) passing through the interlayer insulating layer ILD and the buffer layer BFL. Furthermore, the third power conductive layer PL2c may be electrically connected with the second power conductive layer PL2b through a contact opening (e.g., a contact hole) passing through the interlayer insulating layer ILD. The third power conductive layer PL2c, the first power conductive layer PL2a, and/or the second power conductive layer PL2b may form the second power line PL2 described with reference to, for example, FIG. 4, etc.

The first and second transistor electrodes TE1 and TE2 and the third power conductive layer PL2c may each have a single layer or a multilayer structure formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof.

A passivation layer PSV may be disposed on the first and second transistor electrodes TE1 and TE2 and the third power conductive layer PL2c. The passivation layer PSV may be formed of a single layer or multiple layers and may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A via layer VIA may be disposed on the passivation layer PSV. The via layer VIA may be formed of an organic material for planarizing a stepped structure provided therebelow. For example, the via layer VIA may include an organic material, such as acrylic resin, epoxy resin, phenolic resin, polyamide resin, polyimide resin, polyester resin, polyphenylene sulfide resin, or benzocyclobutene (BCB). However, the present disclosure is not limited thereto. The via layer VIA may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The first bank BNK1 may be disposed on the via layer VIA. The first bank BNK1 may have an opening OP. The first bank BNK1 may be disconnected by the opening OP. The opening OP in the first bank BNK1 may at least partially expose the via layer VIA disposed under the first bank BNK1.

The first bank BNK1 may have various shapes depending on embodiments. In an embodiment, the first bank BNK1 may have a shape protruding from the base layer BSL in the third direction (e.g., the Z-axis direction in FIG. 7). Furthermore, the first bank BNK1 may have an inclined surface angled with respect to the base layer BSL at an angle (e.g., at a predetermined angle). However, the present disclosure is not limited thereto. The first bank BNK1 may have a sidewall having a curved or stepped shape. For example, the first bank BNK1 may have a semi-circular or semi-elliptical cross-section.

The first bank BNK1 may include at least one organic material and/or inorganic material. For example, the first bank BNK1 may include an organic material, such as acrylic resin, epoxy resin, phenolic resin, polyamide resin, polyimide resin, polyester resin, polyphenylene sulfide resin, or benzocyclobutene (BCB). However, the present disclosure is not limited thereto. The first bank BNK1 may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The electrodes ALE may be disposed on the via layer VIA and the first bank BNK1. The electrodes ALE may at least partially cover a sidewall and/or an upper surface of the first bank BNK1. The electrodes ALE that are disposed over the first bank BNK1 each may have a shape corresponding to that of the first bank BNK1. For example, the electrodes ALE that are disposed on the first bank BNK1 may have inclined surfaces or curved surfaces having shapes corresponding to that of the first bank BNK1. In such an embodiment, the first bank BNK1 and the electrodes ALE may act as reflectors and reflect light emitted from the light emitting elements LD to guide the light in the frontal direction of the pixel PXL (e.g., in the third direction or the Z-axis direction in FIG. 7) to improve the light output efficiency of the display panel PNL.

The electrodes ALE may be disposed at positions spaced apart from each other. The electrodes ALE may be disposed on the same layer. For example, the electrodes ALE may be concurrently (or simultaneously) formed through the same process, but the present disclosure is not limited thereto.

The electrodes ALE may be supplied with alignment signals during the step of aligning the light emitting elements LD. Therefore, an electric field may be formed between the electrodes ALE so that the light emitting elements LD that are provided in each of the pixels PXL may be aligned between the electrodes ALE.

The electrodes ALE may include at least one conductive material. For example, the electrodes ALE may include at least one material from among various metal materials, including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxides, such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer, such as PEDOT, but the present disclosure is not limited thereto.

The first electrode ALE1 may be electrically connected to the first transistor electrode TE1 of the transistor M through the first opening VIH1 passing through the via layer VIA and the passivation layer PSV. The second electrode ALE2 may be electrically connected to the third power conductive layer PL2c through the second opening VIH2 passing through the via layer VIA and the passivation layer PSV.

The second bank BNK2 may be disposed on the electrodes ALE. The second bank BNK2 may cover the electrodes ALE and may protect the electrodes ALE. Furthermore, the first area BNK21 of the second bank BNK2 may planarize a stepped structure formed by the electrodes ALE and improve the degree of alignment of the light emitting elements LD. In addition, the second area BNK22 of the second bank BNK2 may overlap the via holes VIH1 and VIH2 and function to planarize a stepped structure formed by the via holes VIH1 and VIH2.

The first area BNK21 and the second area BNK22 of the second bank BNK2 may have different thicknesses. For example, a thickness T22 of the second area BNK22 of the second bank BNK2 with respect to the third direction (e.g., the Z-axis direction in FIG. 7) may be greater than a thickness T21 of the first area BNK21 of the second bank BNK2 with respect to the third direction (e.g., the Z-axis direction in FIG. 6). Hence, the first area BNK21 of the second bank BNK2, which is comparatively thin, may provide space in which the light emitting elements LD can be provided or aligned.

In an embodiment, the thickness T22 of the second area BNK22 of the second bank BNK2 with respect to the third direction (e.g., the Z-axis direction in FIG. 7) may be same as a thickness T1 of the first bank BNK1 with respect to the third direction (e.g., the Z-axis direction in FIG. 7). Here, the term "same" may embrace being substantially the same within a range including a manufacturing tolerance and a measurement error margin as would be understood by one of ordinary skill in the relevant art. In such an embodiment, the second area BNK22 of the second bank BNK2 may be provided in the opening OP in the first bank BNK1 to connect the otherwise disconnected parts of the first bank BNK1 to each other.

The first area BNK21 and the second area BNK22 of the second bank BNK2 may be formed of the same material. For example, the first area BNK21 and the second area BNK22 of the second bank BNK2 may be integrally provided (or integrally formed). The first area BNK21 and the second area BNK22 of the second bank BNK2 may be concurrently (or simultaneously) formed through the same process, but the present disclosure is not limited thereto.

The second bank BNK2 may include an organic material, such as acrylic resin, epoxy resin, phenolic resin, polyamide resin, polyimide resin, polyester resin, polyphenylene sulfide resin, or benzocyclobutene (BCB). However, the present disclosure is not limited thereto, and the second bank BNK2 may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Although, in an embodiment, the first bank BNK1 and the second bank BNK2 are formed of the same material, the present disclosure is not limited thereto. In other embodiments, the first bank BNK1 and the second bank BNK2 are formed of different materials.

In an embodiment, a first insulating layer INS1 may be disposed on the electrodes ALE and/or the second bank BNK2. For example, the first insulating layer INS1 may cover the electrodes ALE in the non-emission area NEA at where the second bank BNK2 is not disposed. Furthermore, the first insulating layer INS1 may cover the first area BNK21 of the second bank BNK2 in the emission area EA. In such an embodiment, the first insulating layer INS1 disposed on the first area BNK21 of the second bank BNK2 may be surface treated to have increased hydrophilicity so that light emitting element ink can be easily provided into the first area BNK21 of the second bank BNK2. However, the present disclosure is not limited thereto. The first insulating layer INS1 may be omitted from the first area BNK21 of the second bank BNK2.

The first insulating layer INS1 may be formed of a single layer or multiple layers and may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The light emitting elements LD may be disposed on the second bank BNK2. The light emitting elements LD may be provided in the first area BNK21 of the second bank BNK2 and disposed between the electrodes ALE.

The light emitting elements LD may be prepared in a diffused form in (e.g., the light emitting elements LD may be diffused or dispersed in) the light emitting element ink and then supplied to each of the pixels PXL by an inkjet printing scheme or the like. For example, the light emitting elements LD may be diffused in a volatile solvent and supplied to each of the pixels PXL. Thereafter, when alignment signals are supplied to the electrodes ALE, an electric field is formed between the electrodes ALE to align the light emitting elements LD between the electrodes ALE. After the light emitting elements LD have been aligned, the solvent may be removed by a volatilization scheme or other schemes. In this way, the light emitting elements LD may be reliably arranged between the electrodes ALE.

A second insulating layer INS2 may be disposed on the light emitting elements LD. For example, the second insulating layer INS2 may be partially provided on the light emitting elements LD so that the first and second ends EP1 and EP2 of the light emitting elements LD are exposed from the second insulating layer INS2. When the second insulating layer INS2 is formed on the light emitting elements LD after the alignment of the light emitting elements LD has been completed, the light emitting elements LD may not be removed from (or moved from) the aligned positions.

The second insulating layer INS2 may be formed of a single layer or multiple layers and may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The connection electrodes ELT may be disposed on the first and second ends EP1 and EP2 of the light emitting elements LD, which are exposed from the second insulating layer INS2. The first connection electrode ELT1 may be directly disposed on the first ends EP1 of the first light emitting elements LD1 to contact the first ends EP1 of the first light emitting elements LD1.

Furthermore, the second connection electrode ELT2 may be directly disposed on the second ends EP2 of the first light emitting elements LD1 to contact the second ends EP2 of the first light emitting elements LD1. Furthermore, the second connection electrode ELT2 may be directly disposed on the first ends EP1 of the second light emitting elements LD2 to contact the first ends EP1 of the second light emitting elements LD2. In other words, the second connection electrode ELT2 may electrically connect the second ends EP2 of the first light emitting elements LD1 with the first ends EP1 of the second light emitting elements LD2.

Similarly, the third connection electrode ELT3 may be directly disposed on the second ends EP2 of the second light emitting elements LD2 to contact the second ends EP2 of the second light emitting elements LD2. Furthermore, the third connection electrode ELT3 may be directly disposed on the first ends EP1 of the third light emitting elements LD3 to contact the first ends EP1 of the third light emitting elements LD3. In other words, the third connection electrode ELT3 may electrically connect the second ends EP2 of the second light emitting elements LD2 with the first ends EP1 of the third light emitting elements LD3.

Similarly, the fourth connection electrode ELT4 may be directly disposed on the second ends EP2 of the third light emitting elements LD3 to contact the second ends EP2 of the third light emitting elements LD3. Furthermore, the fourth connection electrode ELT4 may be directly disposed on the first ends EP1 of the fourth light emitting elements LD4 to contact the first ends EP1 of the fourth light emitting elements LD4. In other words, the fourth connection electrode ELT4 may electrically connect the second ends EP2 of the third light emitting elements LD3 with the first ends EP1 of the fourth light emitting elements LD4.

Similarly, the fifth connection electrode ELT5 may be directly disposed on the second ends EP2 of the fourth light emitting elements LD4 to contact the second ends EP2 of the fourth light emitting elements LD4.

The first connection electrode ELT1 may be electrically connected to the first electrode ALE1 through the first contactor CNT1 passing through the first insulating layer INS1. The fifth connection electrode ELT5 may be electrically connected to the second electrode ALE2 through the second contactor CNT2 passing through the first insulating layer INS1 (see, e.g., FIG. 8).

In an embodiment, the connection electrodes ELT may be formed of a plurality of conductive layers. For example, the first connection electrode ELT1, the third connection electrode ELT3, and the fifth connection electrode ELT5 may be disposed on the same layer. Furthermore, the second connection electrode ELT2 and the fourth connection electrode ELT4 may be disposed on the same layer. For instance, the first connection electrode ELT1, the third connection electrode ELT3, and the fifth connection electrode ELT5 may be disposed on the second insulating layer INS2. A third insulating layer INS3 may be disposed on the first connection electrode ELT1, the third connection electrode ELT3, and the fifth connection electrode ELT5. The second connection electrode ELT2 and the fourth connection electrode ELT4 may be disposed on the third insulating layer INS3.

As such, when the third insulating layer INS3 is disposed between connection electrodes ELT that are formed of different conductive layers, the connection electrodes ELT may be reliably separated from (e.g., electrically and physically separated or isolated) each other by the third insulating layer INS3 so that electrical stability between the first and second ends EP1 and EP2 of the light emitting elements LD can be secured.

The connection electrodes ELT may be formed of various transparent conductive materials. For example, the connection electrodes ELT may include at least one of various transparent conductive materials, including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be substantially transparent or translucent to provide satisfactory transmittance. Hence, light emitted from the first and second ends EP1 and EP2 of the light emitting elements LD may pass through the connection electrodes ELT to be emitted outside the display panel PNL.

The third insulating layer INS3 may be formed of a single layer or multiple layers and may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Figure 9:
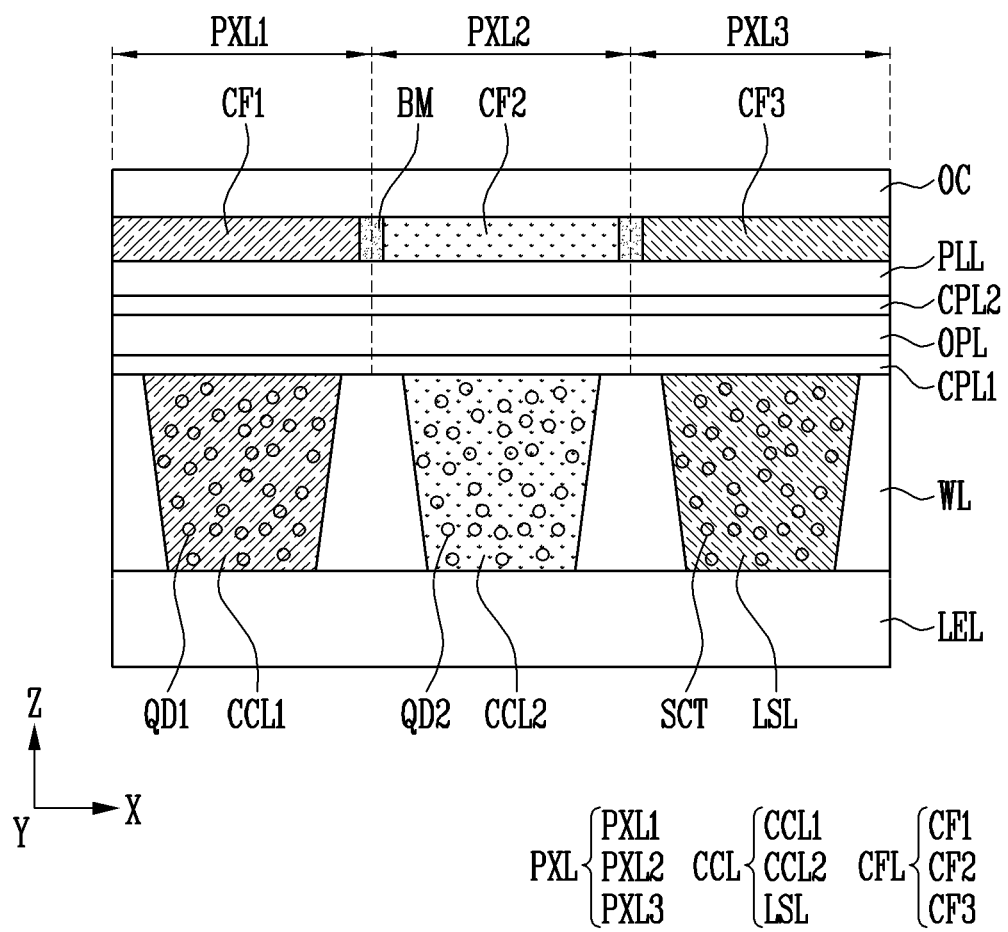
FIG. 9 is a sectional view of first to third pixels in accordance with an embodiment.
Figure 10:
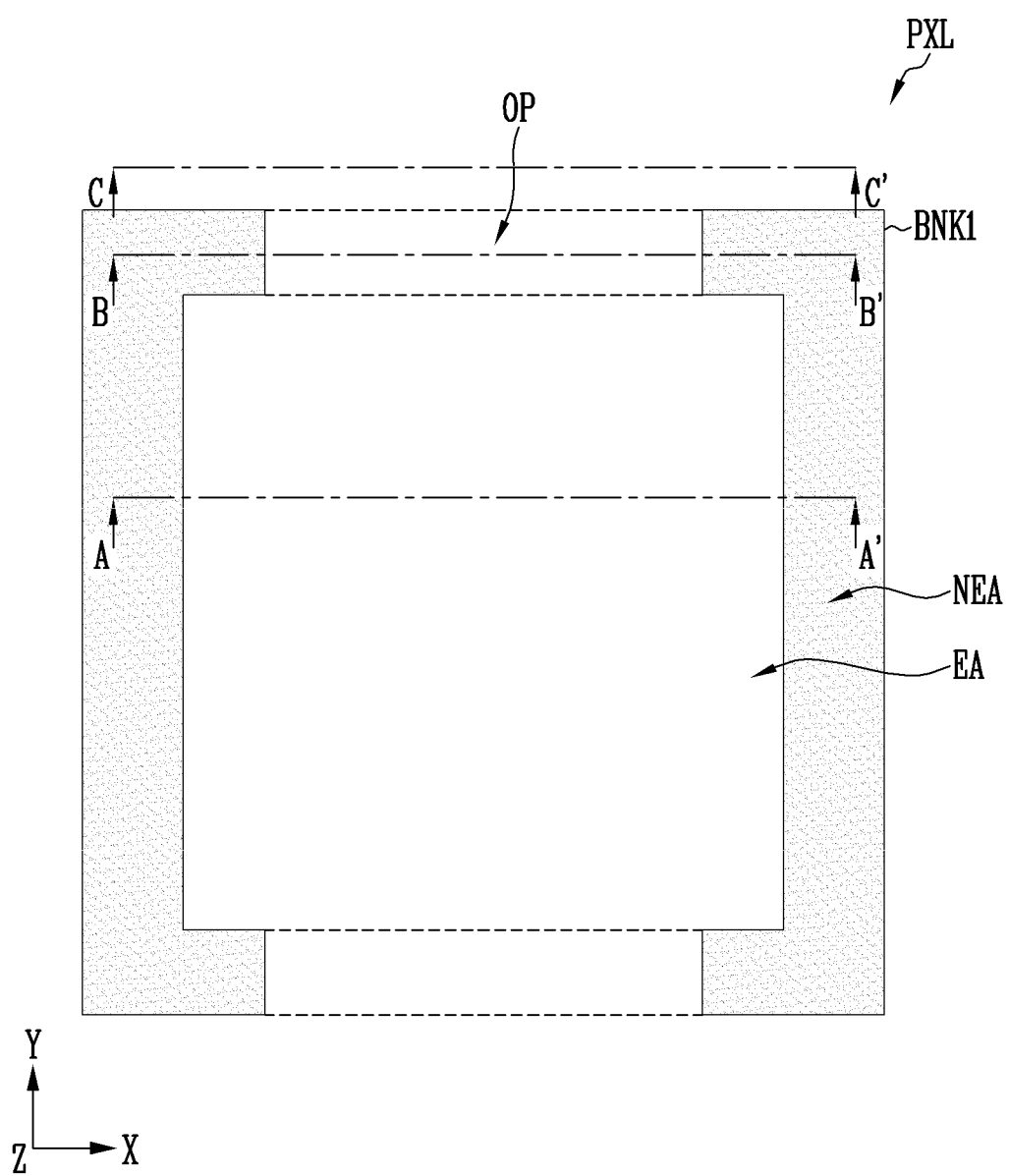
Figure 11:
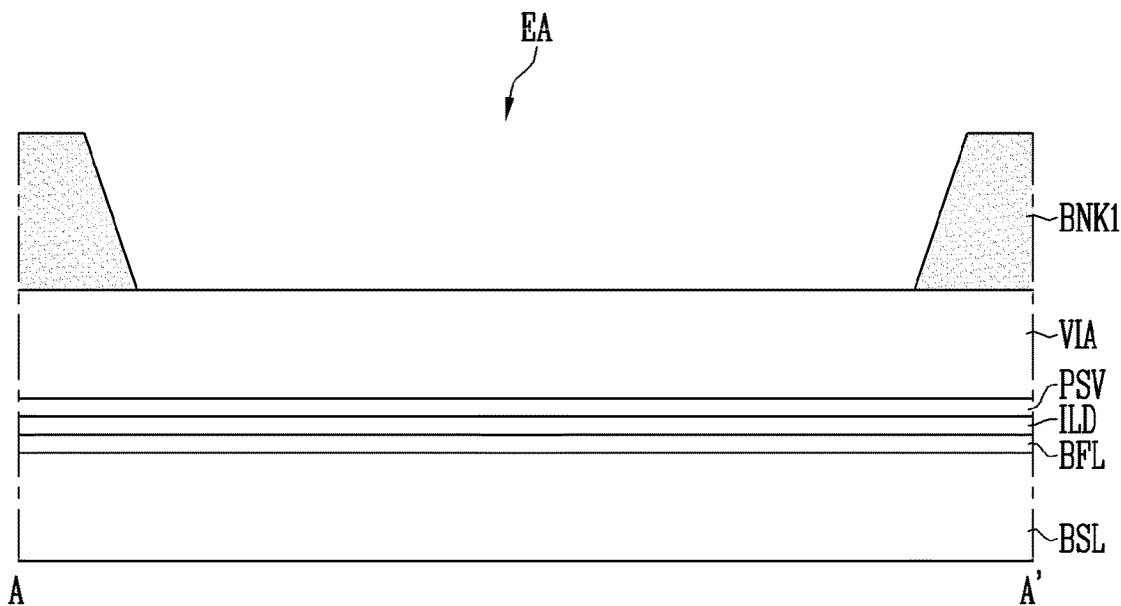
Figure 12:
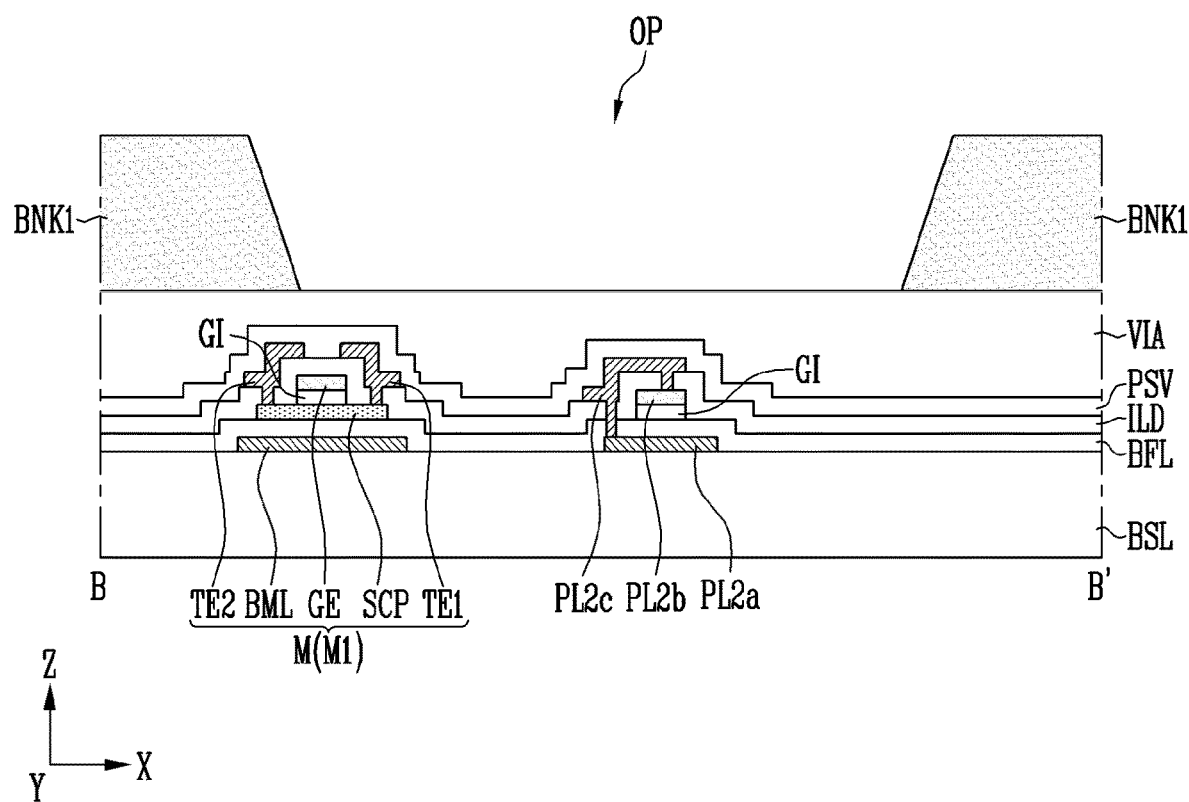
Figure 14:
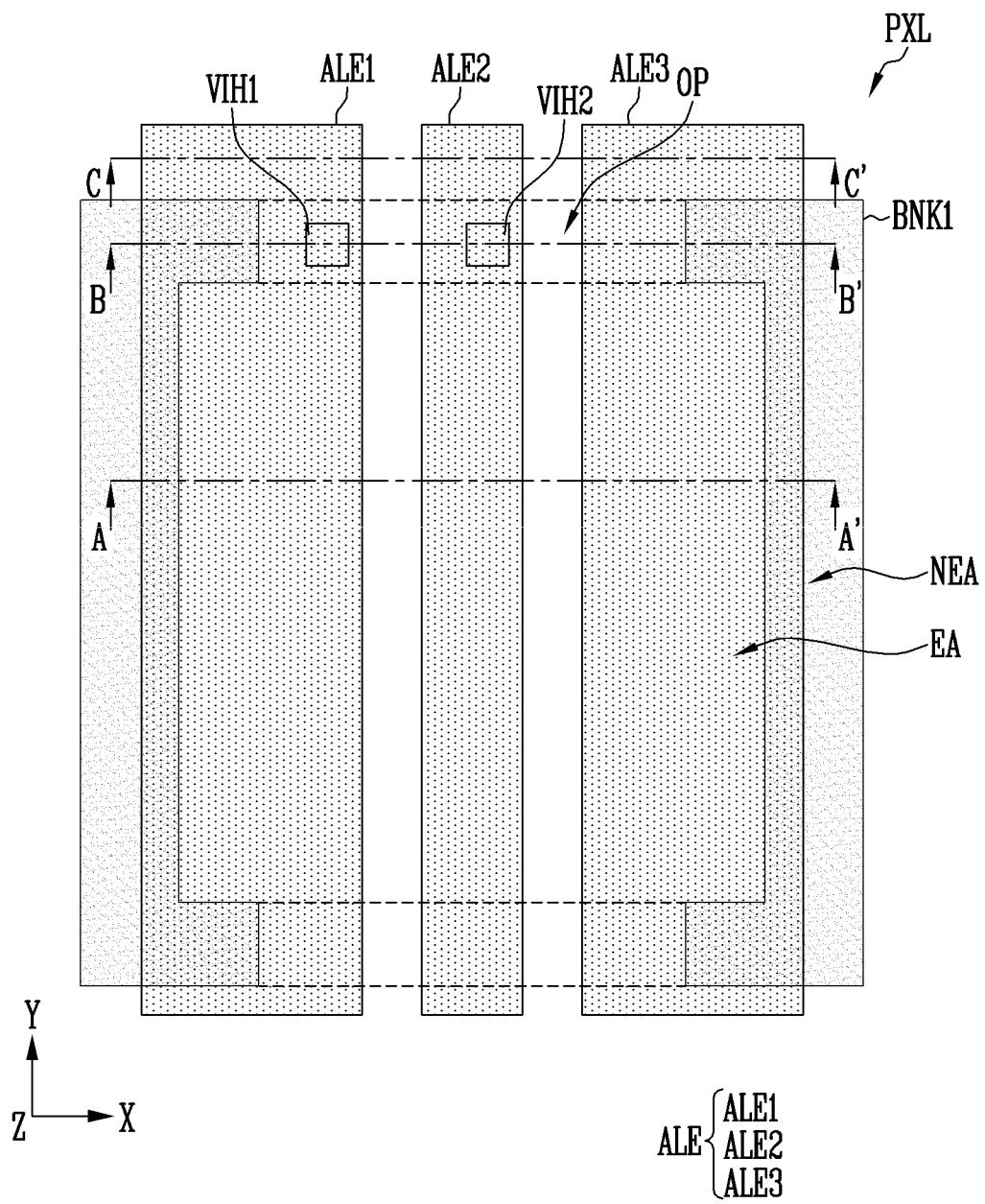
Figure 15:
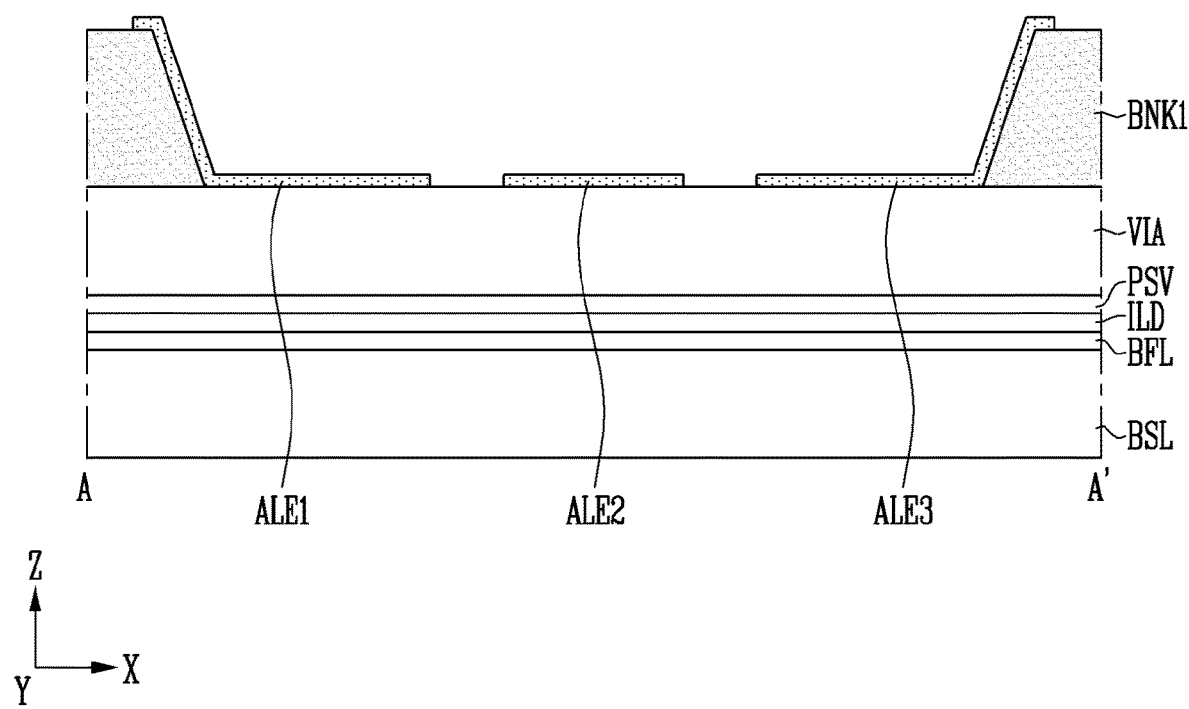
Figure 16:
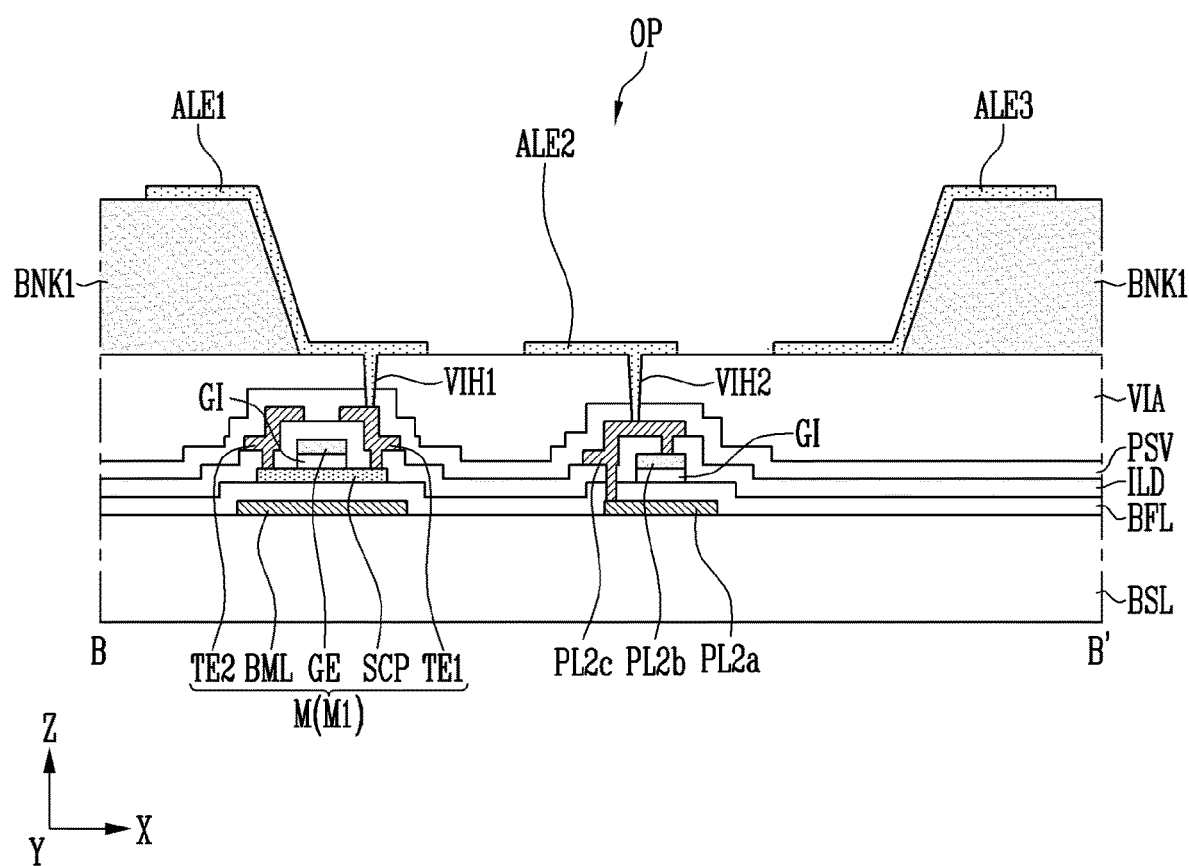
Figure 17:
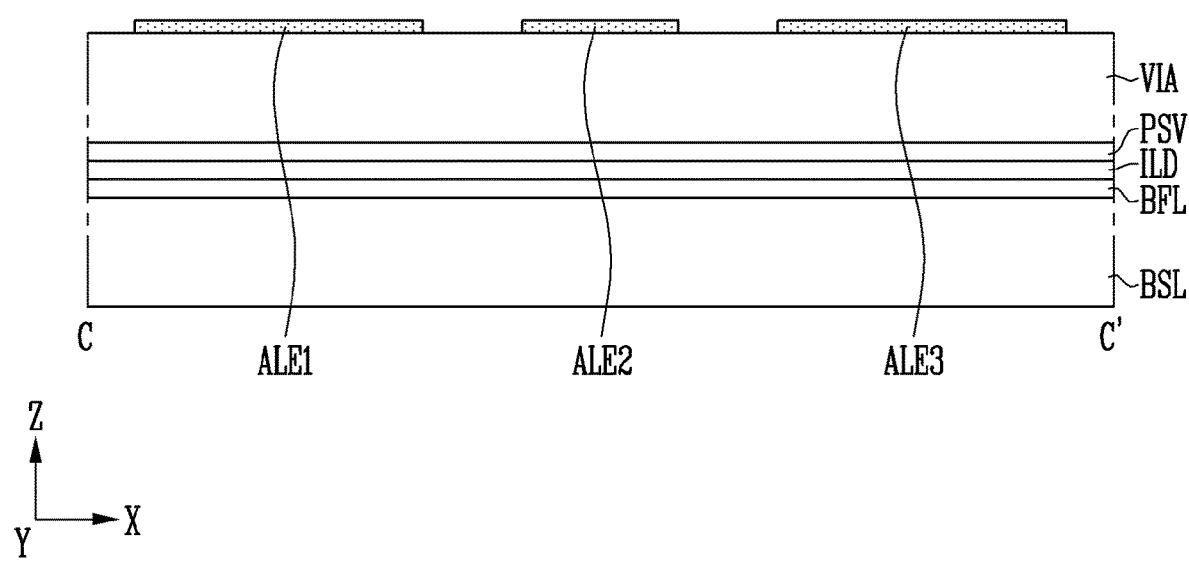
Figure 18:
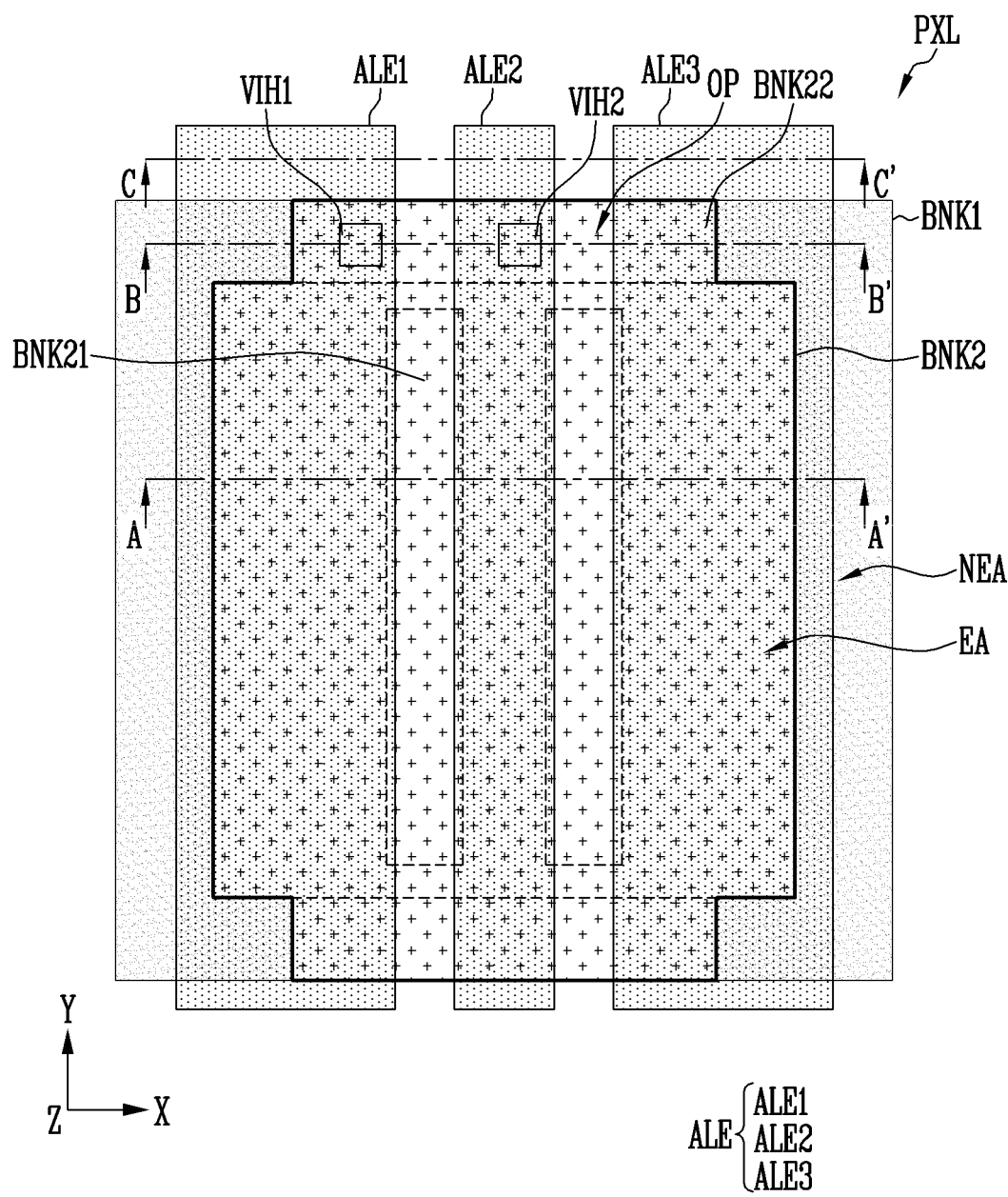

FIG. 9 is a sectional view illustrating first to third pixels in accordance with an embodiment.

FIG. 9 illustrates a partition wall WL, a color conversion layer CCL, an optical layer OPL, and/or a color filter layer CFL, which are provided on the light emitting element LEL of the pixel PXL described with reference to, for example, FIG. 6.

Referring to FIG. 9, the partition wall WL may be disposed on the light emitting element layer LEL for the first to third pixels PXL1, PXL2, and PXL3. For example, the partition wall WL may be disposed between the first to third pixels PXL1, PXL2, and PXL3 or on boundaries therebetween, and may have openings respectively overlapping the first to third pixels PXL1, PXL2, and PXL3. The openings of the partition wall WL may provide space at where the color conversion layer CCL can be provided.

The partition wall WL may include an organic material, such as acrylic resin, epoxy resin, phenolic resin, polyamide resin, polyimide resin, polyester resin, polyphenylene sulfide resin, or benzocyclobutene (BCB). However, the present disclosure is not limited thereto. The partition wall WL may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In an embodiment, the partition wall WL may include at least one light shielding and/or reflective material. Therefore, light leakage between adjacent pixels PXL may be reduced or prevented. For example, the partition wall WL may include at least one black matrix material and/or color filter material. For example, the partition wall WL may be formed of a black opaque pattern, which can block transmission of light. In an embodiment, a reflective layer or the like may be formed on a surface (e.g., a sidewall) of the partition wall WL to increase the light efficiency of each pixel PXL.

The color conversion layer CCL may be disposed on the light emitting element layer LEL, including the light emitting elements LD, in the openings in the partition wall WL. The color conversion layer CCL may include a first color conversion layer CCL1 disposed in the first pixel PXL1, a second color conversion layer CCL2 disposed in the second pixel PXL2, and a light scattering layer LSL disposed in the third pixel PXL3.

In an embodiment, the first, second, and third pixels PXL1, PXL2, and PXL3 may include light emitting elements LD configured to emit the same color of light. For example, the first, second, and third pixels PXL1, PXL2, and PXL3 may include light emitting elements LD configured to emit the third color of light (e.g., blue light). Because the color conversion layer CCL including color conversion particles is disposed in each of the first to third pixels PXL1, PXL2, and PXL3, a full-color image may be displayed.

The first color conversion layer CCL1 may include first color conversion particles for converting the third color of light emitted from the light emitting element LD to the first color of light. For example, the first color conversion layer CCL1 may include a plurality of first quantum dots QD1, which are dispersed in a matrix material, such as a base resin.

In an embodiment, when the light emitting element LD is a blue light emitting element configured to emit blue light and the first pixel PXL1 is a red pixel, the first color conversion layer CCL1 may include the first quantum dots QD1 that convert blue light emitted from the blue light emitting element to red light. The first quantum dots QD1 may absorb blue light, shift the wavelength thereof according to an energy transition, and emit red light. When the first color pixel PXL1 is one of the pixels having other colors, the first color conversion layer CCL1 may include the first quantum dots QD1 corresponding to the color of the first pixel PXL1.

The second color conversion layer CCL2 may include second color conversion particles for converting the third color of light emitted from the light emitting element LD to the second color of light. For example, the second color conversion layer CCL2 may include a plurality of second quantum dots QD2 dispersed in a matrix material, such as a base resin.

In an embodiment, when the light emitting element LD is a blue light emitting element configured to emit blue light and the second pixel PXL2 is a green pixel, the second color conversion layer CCL2 may include the second quantum dots QD2 that convert blue light emitted from the blue light emitting element to green light. The second quantum dots QD2 may absorb blue light, shift the wavelength thereof according to an energy transition, and emit green light. When the second color pixel PXL2 is one of the pixels having other colors, the second color conversion layer CCL2 may include the second quantum dots QD2 corresponding to the color of the second pixel PXL2.

In an embodiment, because blue light has a relatively short wavelength from among visible light and is incident on each of the first quantum dots QD1 and the second quantum dots QD2, absorption coefficients of the first quantum dot QD1 and the second quantum dot QD2 may be increased. Therefore, eventually, the efficiency of light emitted from the first pixel PXL1 and the second pixel PXL2 may be enhanced, and satisfactory color reproducibility may be secured. Furthermore, because an emission circuit EMU including the first to third sub-pixels SPXL1, SPXL2, and SPXL3 is formed of light emitting elements LD (e.g., blue light emitting elements) configured to emit the same color of light, the efficiency of fabricating the display device may be enhanced.

The light scattering layer LSL may be provided to efficiently use (or emit) the third color of light (e.g., blue light) emitted from the light emitting element LD. For example, when the light emitting element LD is a blue light emitting element configured to emit blue light and the third pixel PXL3 is a blue pixel, the light scattering layer LSL may include at least one type of light scatter SCT to efficiently use light emitted from the light emitting element LD.

For example, the light scattering layer LSL may include a plurality of light scatters SCT dispersed in a matrix material, such as base resin. For instance, the light scattering layer LSL may include a light scatter SCT formed of a material, such as silica, but the constituent material of the light scatter SCT is not limited thereto. The light scatters SCT may not only be provided in the third pixel PXL3 but may also be selectively included in the first conversion layer CCL1 or the second color conversion layer CCL2. In an embodiment, the light scatters SCT may be omitted, and the light scattering layer LSL may be formed of transparent polymer.

A first capping layer CPL1 may be disposed on the color conversion layer CCL. The first capping layer CPL1 may be provided over the first to third pixels PXL1, PXL2, and PXL3. The first capping layer CPL1 may cover the color conversion layer CCL. The first capping layer CPL1 may prevent the color conversion layer CCL from being damaged or contaminated by permeation of external impurities, such as water or air.

The first capping layer CPL1 may be an inorganic layer and may be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

The optical layer OPL may be disposed on the first capping layer CPL1. The optical layer OPL may recycle light provided from (or emitted through) the color conversion layer CCL by total reflection and, thus, enhance light extraction efficiency. The optical layer OPL may have a relatively low refractive index compared to that of the color conversion layer CCL. For example, the refractive index of the color conversion layer CCL may be in a range from approximately 1.6 to approximately 2.0, and the refractive index of the optical layer OPL may be in a range from approximately 1.1 to approximately 1.3.

A second capping layer CPL2 may be disposed on the optical layer OPL. The second capping layer CPL2 may be provided over the first to third pixels PXL1, PXL2, and PXL3. The second capping layer CPL2 may cover the optical layer OPL. The second capping layer CPL2 may prevent the optical layer OPL from being damaged or contaminated by permeation of external impurities, such as water or air.

The second capping layer CPL2 may be an inorganic layer and may be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

A planarization layer PLL may be disposed on the second capping layer CPL2. The planarization layer PLL may be provided over the first to third pixels PXL1, PXL2, and PXL3.

The planarization layer PLL may include an organic material, such as acrylic resin, epoxy resin, phenolic resin, polyamide resin, polyimide resin, polyester resin, polyphenylene sulfide resin, or benzocyclobutene (BCB). However, the present disclosure is not limited thereto, and the planarization layer PLL may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be disposed on the planarization layer PLL. The color filter layer CFL may include color filters CF1, CF2, and CF3 corresponding to the colors of the respective pixels PXL. The color filters CF1, CF2, and CF3, which correspond to the respective colors of the first to third pixels PXL1, PXL2, and PXL3, provide for display of a full-color image.

The color filter layer CFL may include a first color filter CF1 disposed in the first pixel PXL1 and configured to allow light emitted from the first pixel PXL1 to selectively pass therethrough, a second color filter CF2 disposed in the second pixel PXL2 and configured to allow light emitted from the second pixel PXL2 to selectively pass therethrough, and a third color filter CF3 disposed in the third pixel PXL3 and configured to allow light emitted from the third pixel PXL3 to selectively pass therethrough.

In an embodiment, the first color filter CF1, the second color filter CF2, and the third color filter CF3 may be, respectively, a red color filter, a green color filter, and a blue color filter, but the present disclosure is not limited thereto. Hereinafter, the term "color filter CF" or "color filters CF" will be used to refer to any color filter from among the first color filter CF1, the second color filter CF2, and the third color filter CF3 or to comprehensively refer to any two or more kinds of color filters.

The first color filter CF1 may overlap the light emitting element layer LEL (or the light emitting elements LD) of the first pixel PXL1 and the first color conversion layer CCL1 in the third direction (e.g., the Z-axis direction in FIG. 9). The first color filter CF1 may include color filter material for allowing the first color of light (e.g., red light) to selectively pass therethrough. For example, when the first pixel PXL1 is a red pixel, the first color filter CF1 may include red color filter material.

The second color filter CF2 may overlap the light emitting element layer LEL (or the light emitting elements LD) of the second pixel PXL2 and the second color conversion layer CCL2 in the third direction (e.g., the Z-axis direction in FIG. 9). The second color filter CF2 may include color filter material for allowing the second color of light (e.g., green light) to selectively pass therethrough. For example, when the second pixel PXL2 is a green pixel, the second color filter CF2 may include green color filter material.

The third color filter CF3 may overlap the light emitting element layer LEL (or the light emitting elements LD) of the third pixel PXL3 and the light scattering layer LSL in the third direction (e.g., the Z-axis direction in FIG. 9). The third color filter CF3 may include color filter material for allowing the third color of light (e.g., blue light) to selectively pass therethrough. For example, when the third pixel PXL3 is a blue pixel, the third color filter CF3 may include blue color filter material.

A light shielding layer BM may be disposed between the first to third color filters CF1, CF2, and CF3. When the light shielding layer BM is formed between the first to third color filters CF1, CF2, and CF3, a color mixing defect, which is visible from a front surface or side surface of the display device, may not occur. The material of the light shielding layer BM is not particularly limited, and various suitable light shielding materials may be used to form the light shielding layer BM. For example, the light shielding layer BM may be embodied by stacking the first to third color filters CF1, CF2, and CF3 one on another.

An overcoat layer OC may be disposed on the color filter layer CFL. The overcoat layer OC may be provided over the first to third pixels PXL1, PXL2, and PXL3. The overcoat layer OC may cover a lower component (or layer) including the color filter layer CFL. The overcoat layer OC may prevent water or air from permeating to the lower component. Furthermore, the overcoat layer OC may protect the lower component from foreign material, such as dust.

The overcoat layer OC may include an organic material, such as acrylic resin, epoxy resin, phenolic resin, polyamide resin, polyimide resin, polyester resin, polyphenylene sulfide resin, or benzocyclobutene (BCB). However, the present disclosure is not limited thereto. The overcoat layer OC may include various inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

According to the foregoing embodiment, the electrodes ALE may be formed on the first bank BNK1 and may act as reflectors so that the light output efficiency of the display panel PNL may be enhanced. In addition, the second bank BNK2 may both connect the disconnected parts of the first bank BNK1 that are separated from each other by the opening OP and form space in which the light emitting elements LD can be provided in the emission area EA. Therefore, the degree of alignment of the light emitting elements LD may be enhanced.

Hereinafter, a method of fabricating the display device in accordance with an embodiment will be described.

FIGS. 10 to 29 are plan views and sectional views illustrating steps of a method of fabricating the display device in accordance with an embodiment. FIGS. 10 to 29 are plan views and sectional views for describing the method of fabricating the display device based on FIGS. 5 to 8. Like references will be used to designate substantially the same components as those of the embodiments described above with reference to FIGS. 5 to 8, and detailed explanations thereof may be omitted.

Referring to FIGS. 10 to 13, the first bank BNK1 is formed on the base layer BSL, on which the circuit elements including the transistors M and various lines connected to the circuit elements are formed.

The first bank BNK1 may be formed in the non-emission area NEA and may be formed to at least partially enclose (e.g., to extend around a periphery of) the emission area EA. The first bank BNK1 may have at least one opening OP. The first bank BNK1 may be partially disconnected by the opening OP. For example, the opening OP in the first bank BNK1 may provide space or a path through which lines, to be formed during a subsequent process, pass.

Referring to FIGS. 14 to 17, thereafter, the electrodes ALE that are spaced apart from each other may be formed on the first bank BNK1. The electrodes ALE may be formed in at least the emission area EA. The electrodes ALE may extend in the second direction (e.g., the Y-axis direction in FIG. 14) and may be spaced apart from each other in the first direction (e.g., the X-axis direction in FIG. 14). At least some of the electrodes ALE may extend in the second direction (e.g., the Y-axis direction in FIG. 14) through the opening OP in the first bank BNK1. Hence, at least some of the electrodes ALE may extend to adjacent pixels PXL.

The first to third electrodes ALE1, ALE2, and ALE3 may each extend in the second direction (e.g., the Y-axis direction in FIG. 14) and may be spaced apart from each other in the first direction (e.g., the X-axis direction in FIG. 14) and successively disposed. The first to third electrodes ALE1, ALE2, and ALE3 may be disposed on the same layer. For example, the first to third electrodes ALE1, ALE2, and ALE3 may be concurrently (or simultaneously) formed through the same process, but the present disclosure is not limited thereto.

The electrodes ALE may at least partially overlap the first bank BNK1. The electrodes ALE may at least partially cover a sidewall and/or an upper surface of the first bank BNK1. The electrodes ALE that are disposed on (or over) the first bank BNK1 may each have a shape corresponding to that of the first bank BNK1. For example, the electrodes ALE that are disposed on the first bank BNK1 may have inclined surfaces or curved surfaces having shapes corresponding to that of the first bank BNK1. In such an embodiment, as described above, the first bank BNK1 and the electrodes ALE may act as reflectors to reflect light emitted from the light emitting elements LD and guide the light in the frontal direction of the pixel PXL in the third direction (e.g., the Z-axis direction in FIG. 14), to enhance the light output efficiency of the display panel PNL.

The first electrode ALE1 may be electrically connected to the first transistor electrode TE1 of the transistor M through the first opening VIH1 passing through the via layer VIA and the passivation layer PSV. The second electrode ALE2 may be electrically connected to the third power conductive layer PL2c through the second opening VIH2 passing through the via layer VIA and the passivation layer PSV.

Referring to FIGS. 18 to 21, the second bank BNK2 is formed in the emission area EA and the non-emission area NEA. The first areas BNK21 of the second bank BNK2 may be at least partially formed on the electrodes ALE in the emission area EA. The first areas BNK21 of the second bank BNK2 may provide space in which the light emitting elements LD can be provided and/or aligned during a subsequent process. The first areas BNK21 of the second bank BNK2 may extend in the second direction (e.g., the Y-axis direction in FIG. 18) and may be spaced apart from each other in the first direction (e.g., the X-axis direction in FIG. 18). The second bank BNK2 may cover the electrodes ALE to protect the electrodes ALE. Furthermore, the first area BNK21 of the second bank BNK2 may planarize a stepped structure formed by the electrodes ALE and improve the degree of alignment of the light emitting elements LD.

The second area BNK22 of the second bank BNK2 may be formed in the opening OP in the first bank BNK1 in the non-emission area NEA. The second area BNK22 of the second bank BNK2 may be disposed in the opening OP in the first bank BNK1 to connect the disconnected parts of the first bank BNK1 to each other. Hence, a desired kind and/or amount of light emitting element ink may be supplied to the emission area EA enclosed by the first bank BNK1 and the second area BNK22 of the second bank BNK2. In addition, the second area BNK22 of the second bank BNK2 may overlap the openings VIH1 and VIH2 to planarize a stepped structure formed by the openings VIH1 and VIH2.

The first area BNK21 and the second area BNK22 of the second bank BNK2 may have different thicknesses. For example, the thickness T22 of the second area BNK22 of the second bank BNK2 with respect to the third direction (e.g., the Z-axis direction in FIGS. 19 and 20) may be greater than the thickness T21 of the first area BNK21 of the second bank BNK2 with respect to the third direction (e.g., the Z-axis direction in FIGS. 19 and 20). Hence, the first area BNK21 of the second bank BNK2, which is comparatively thin, may provide space in which the light emitting elements LD can be provided or aligned.

Figure 19:
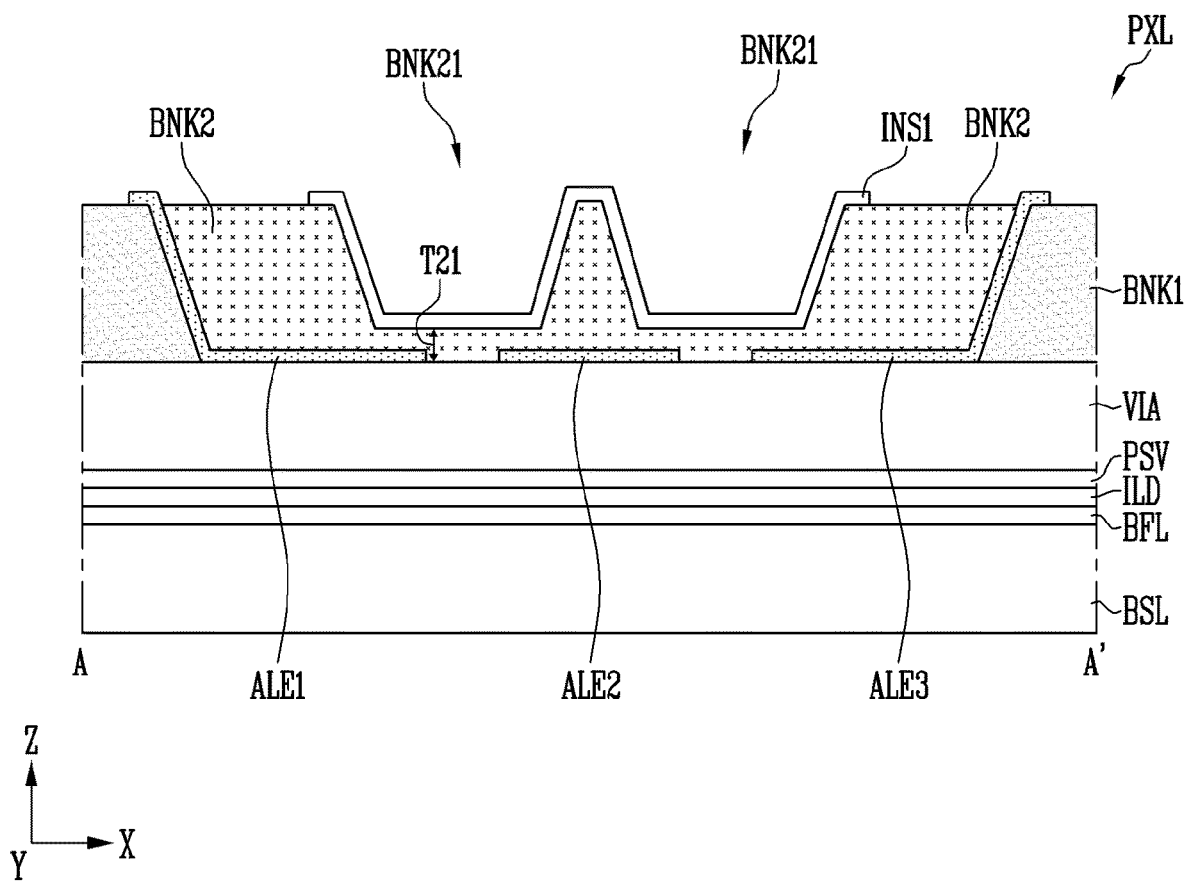
Figure 20:
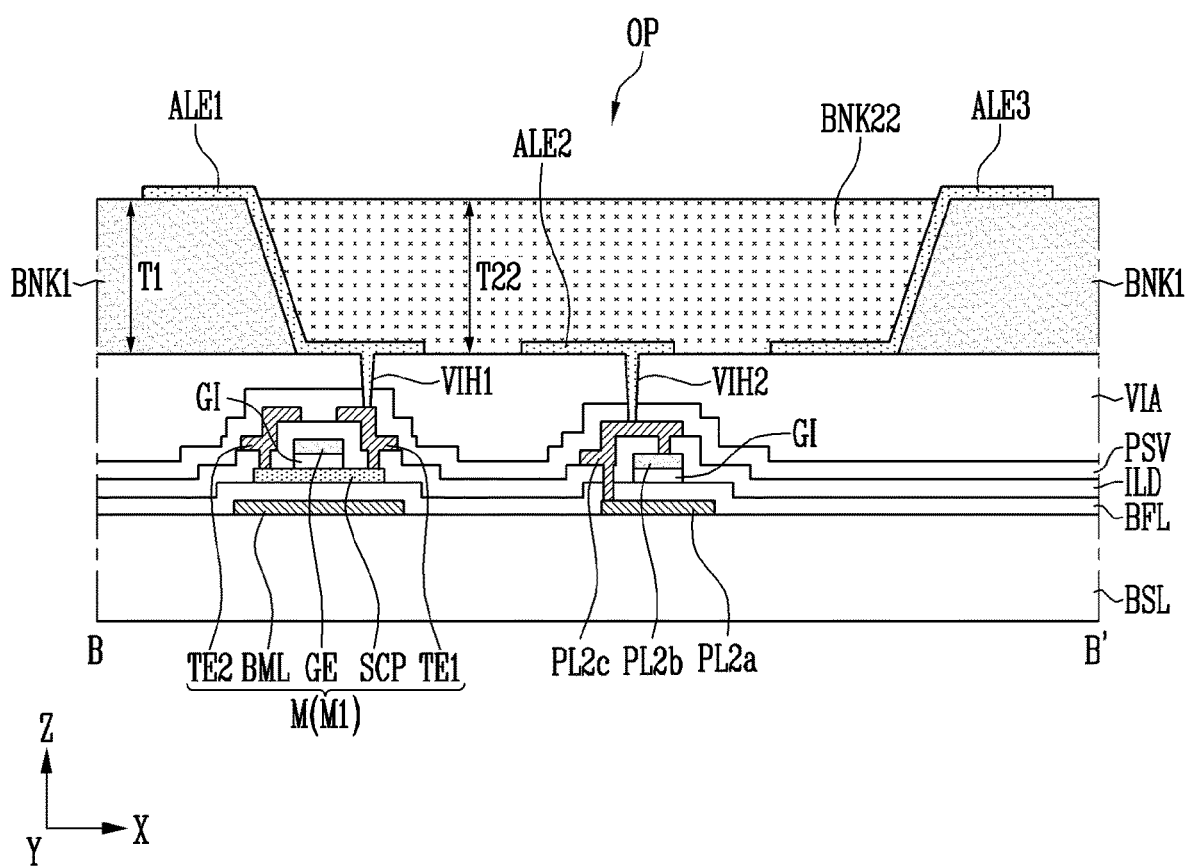
Figure 21:
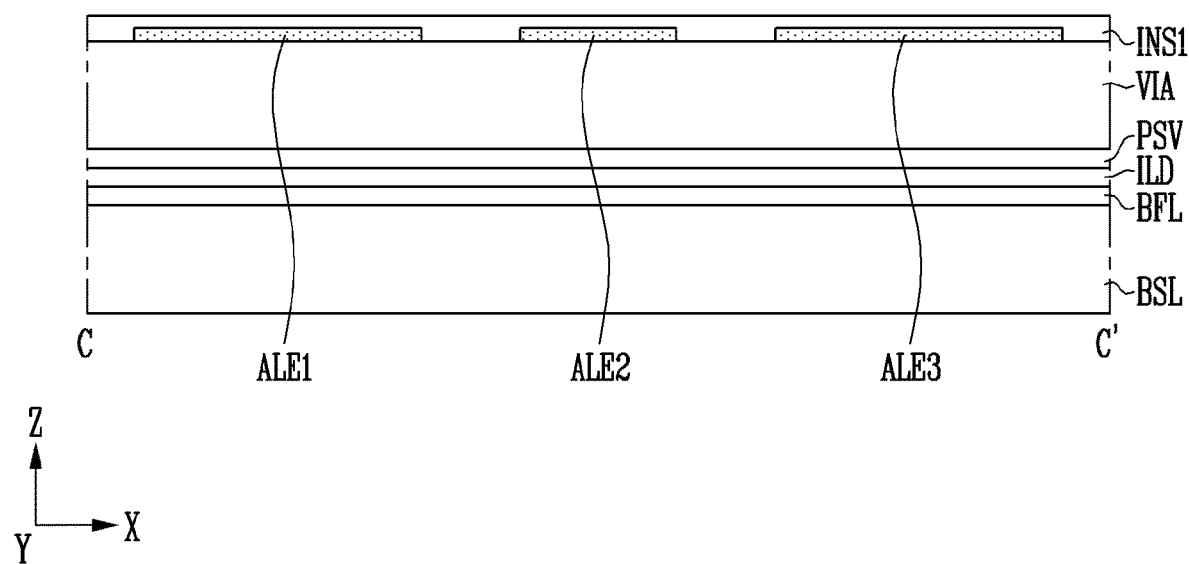
Figure 22:
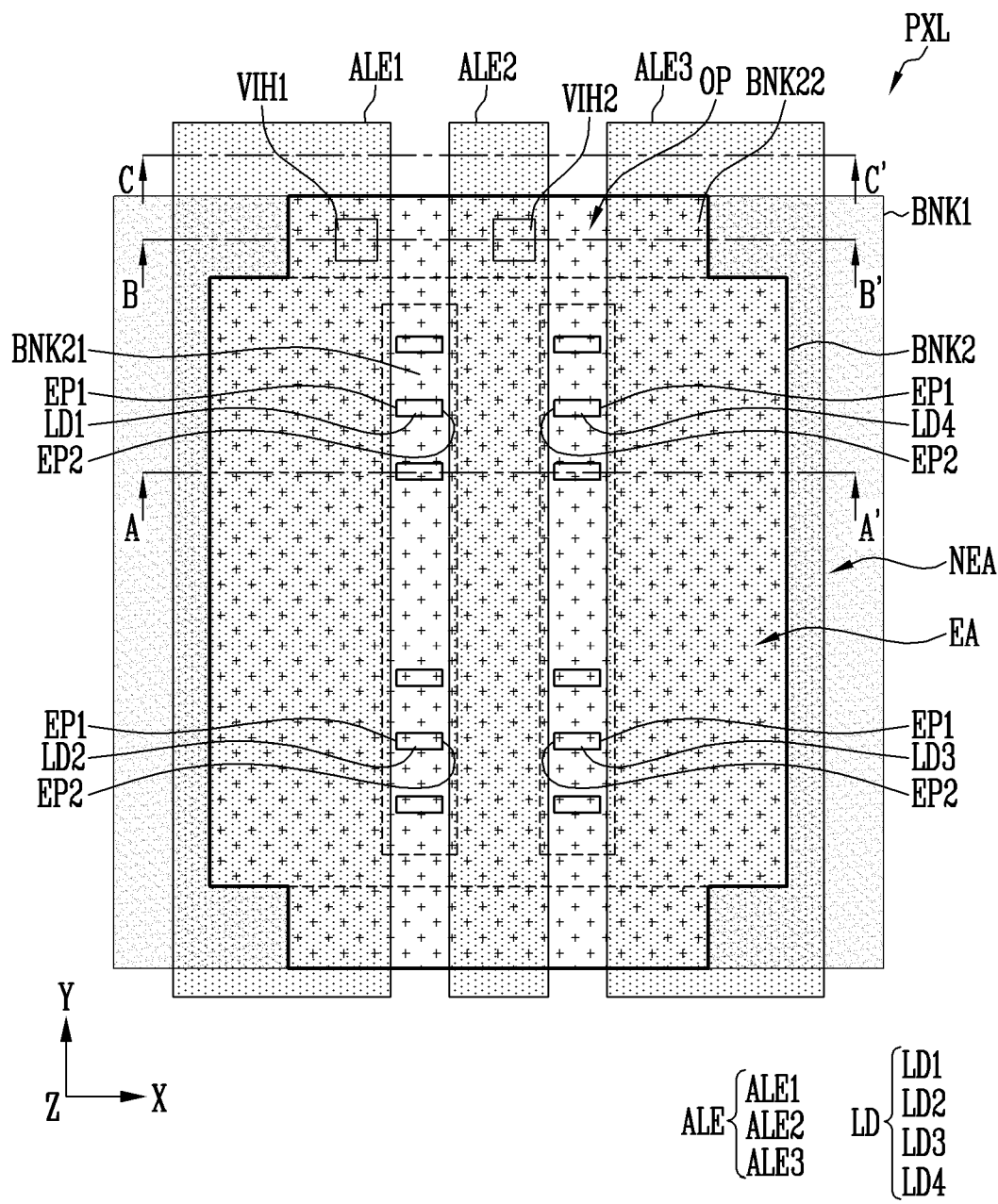
Figure 23:
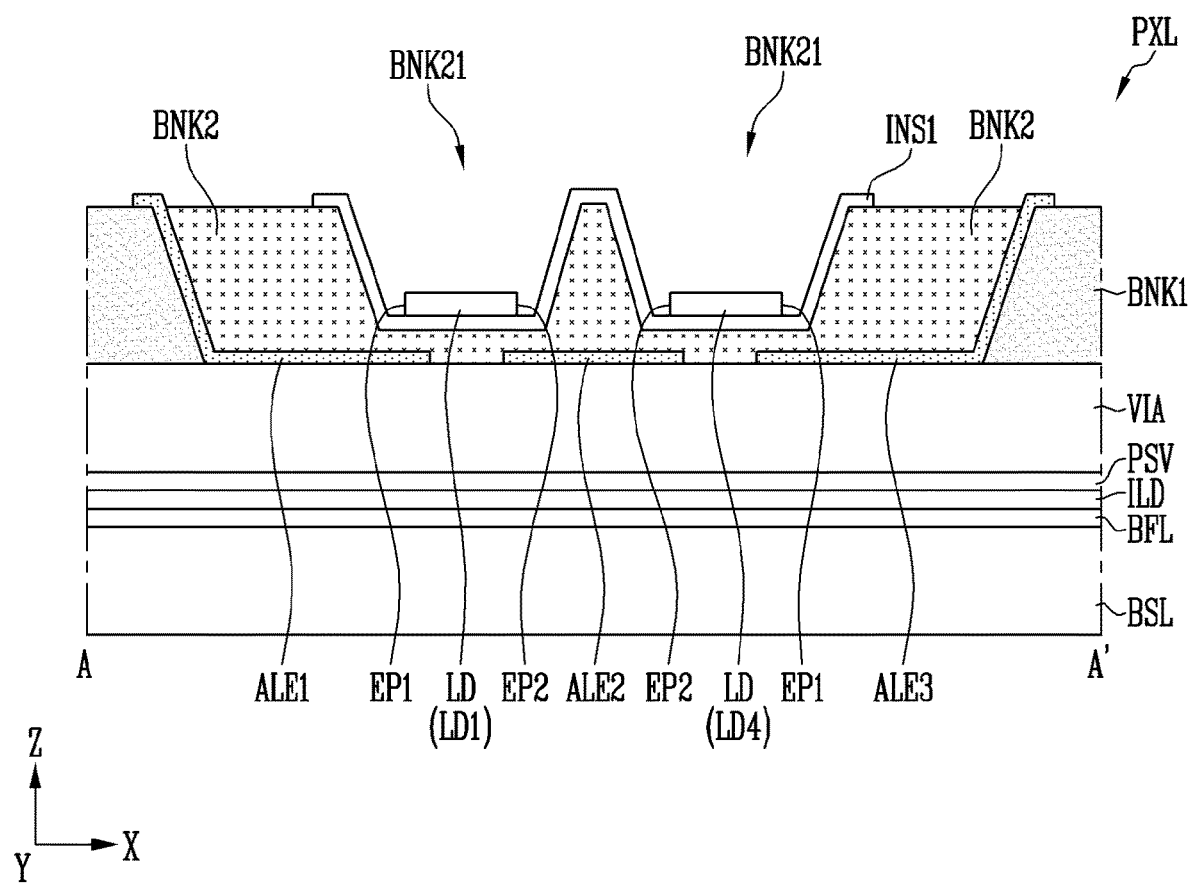
Figure 24:
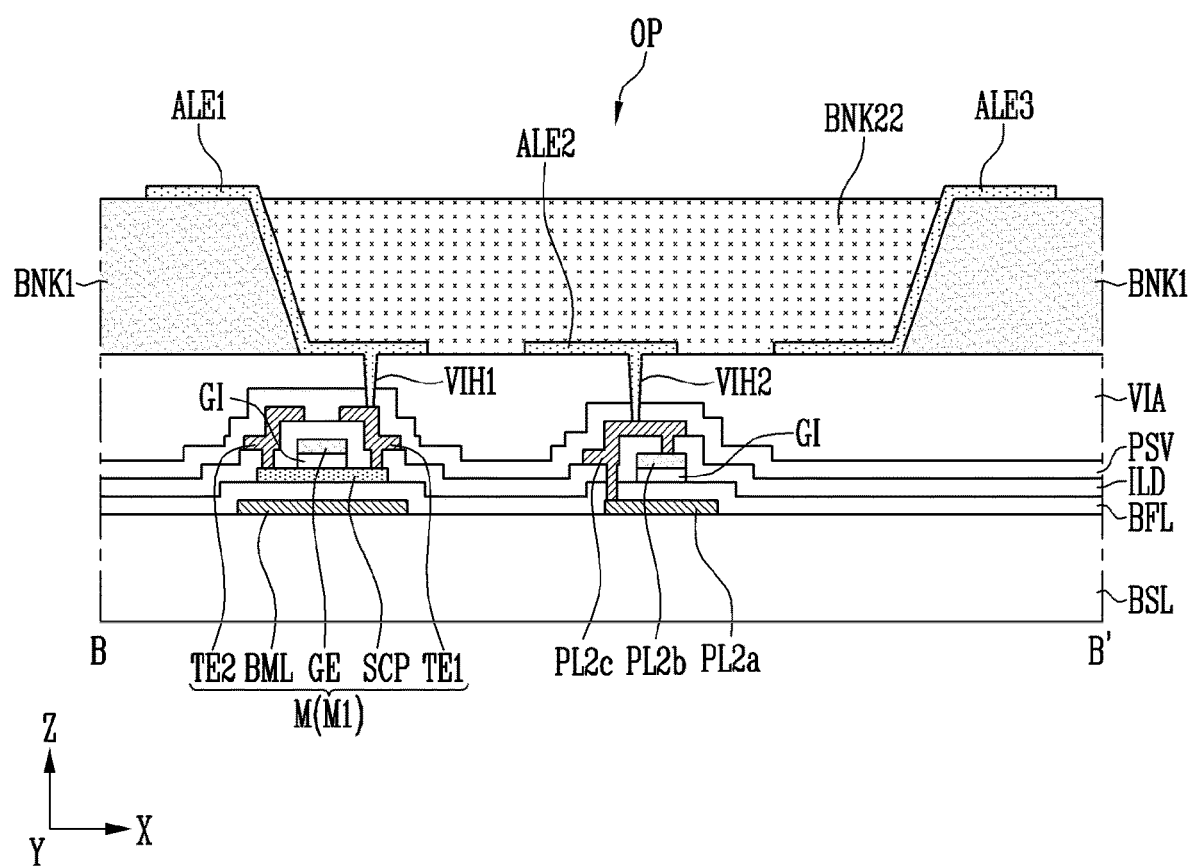
Figure 25:
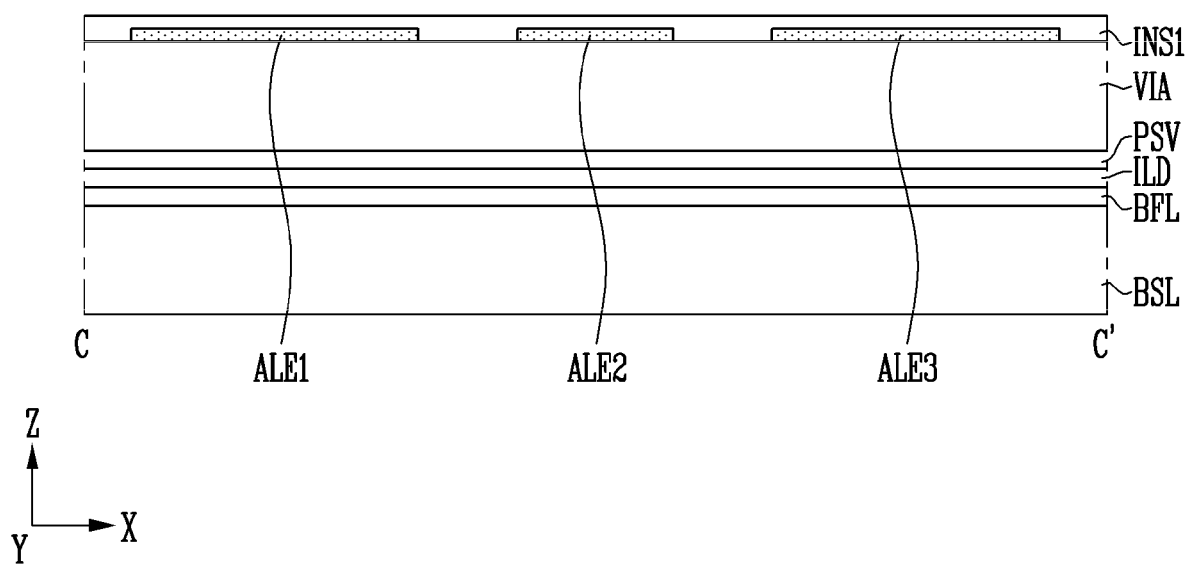
Figure 26:
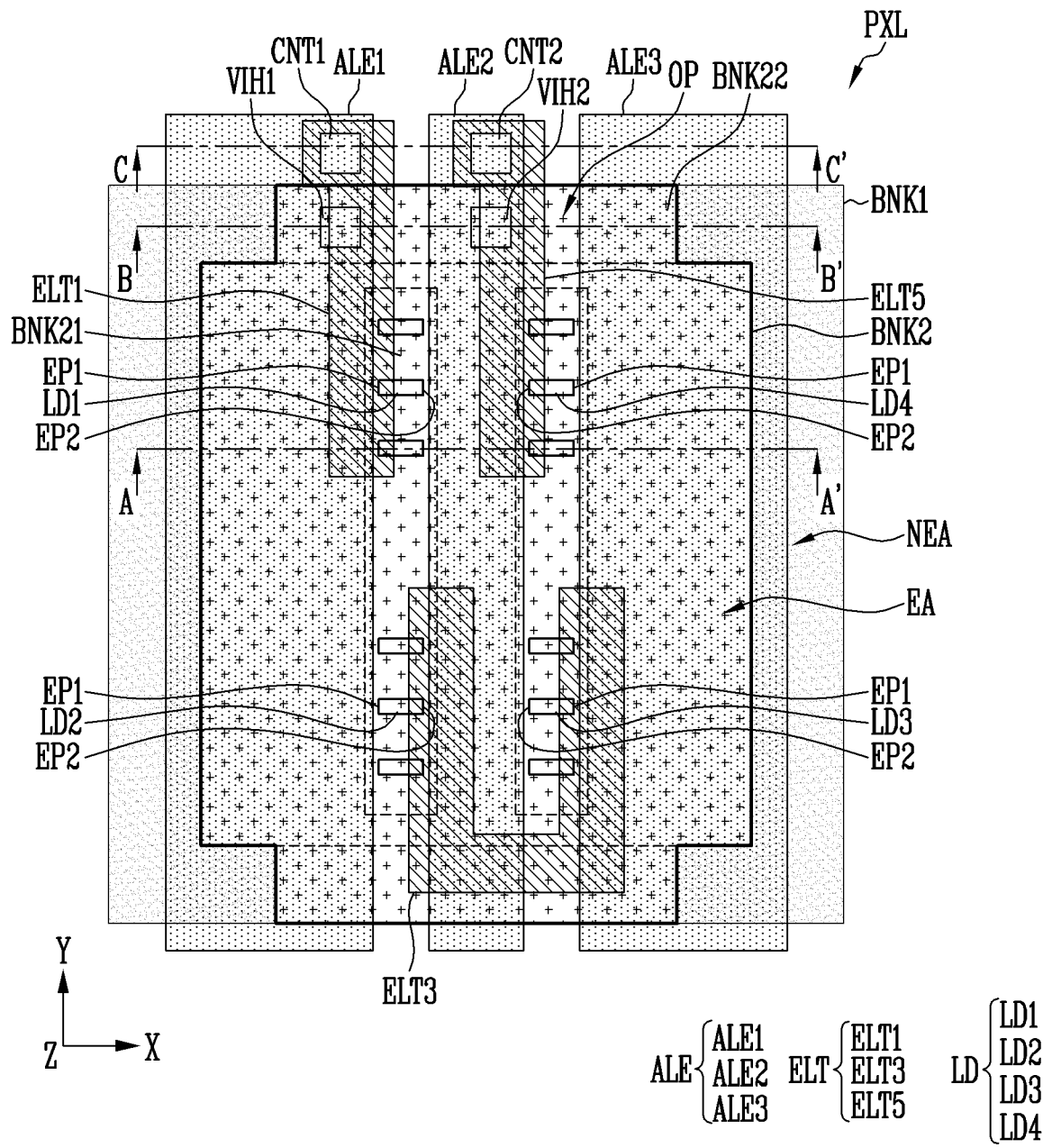
Figure 27:
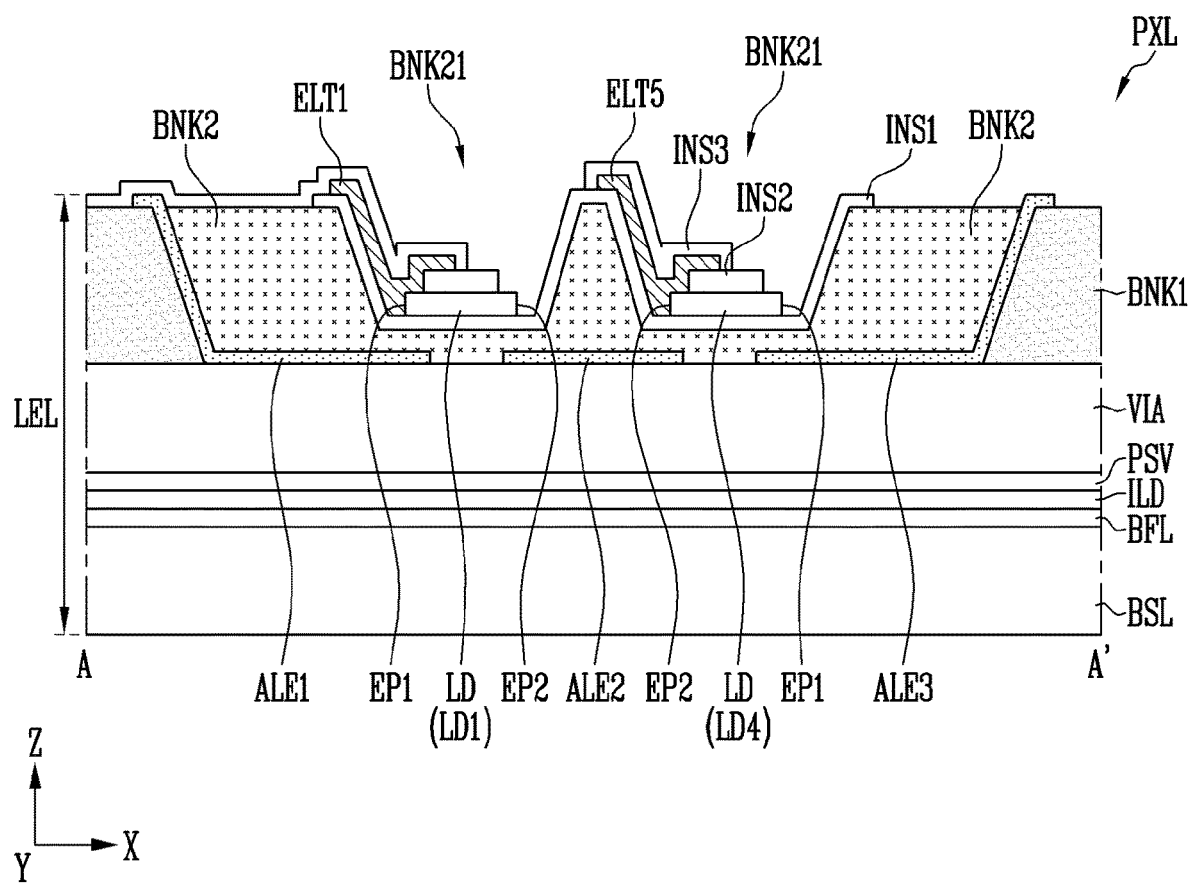
Figure 28:
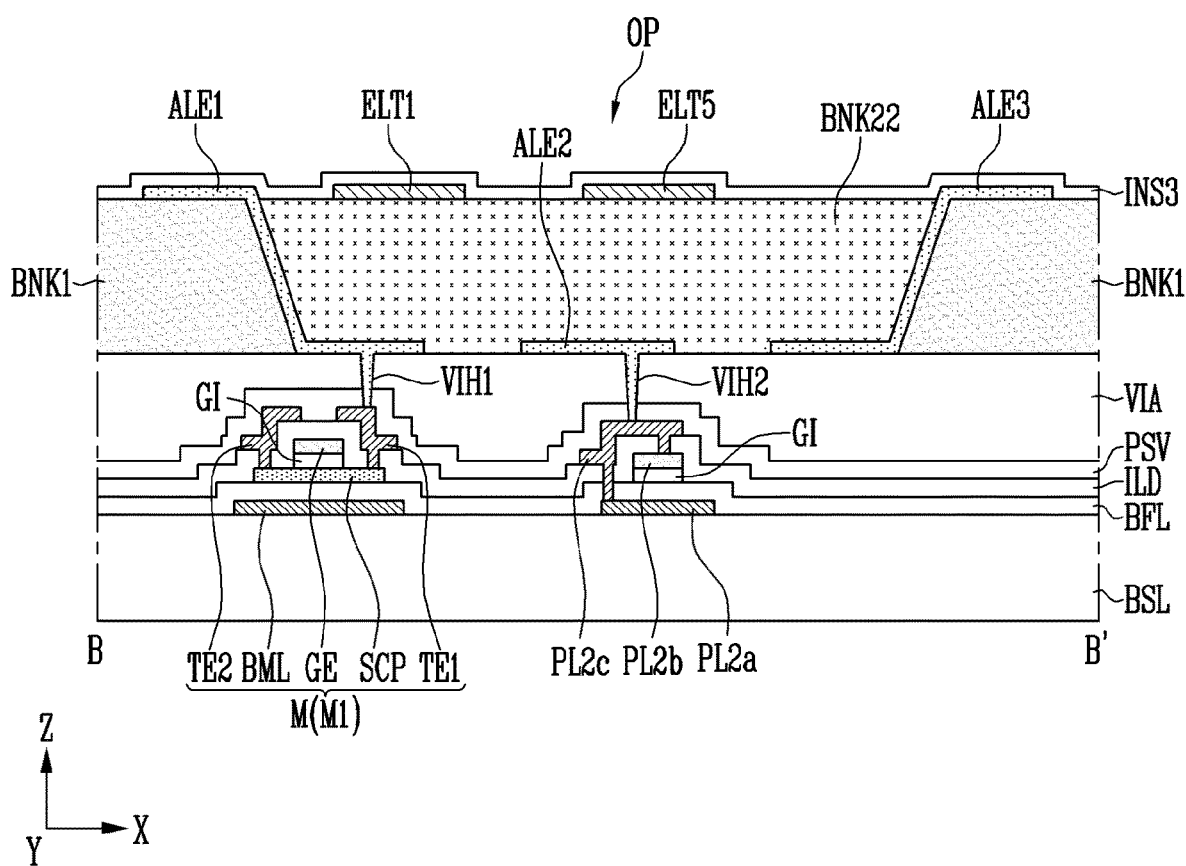
Figure 29:
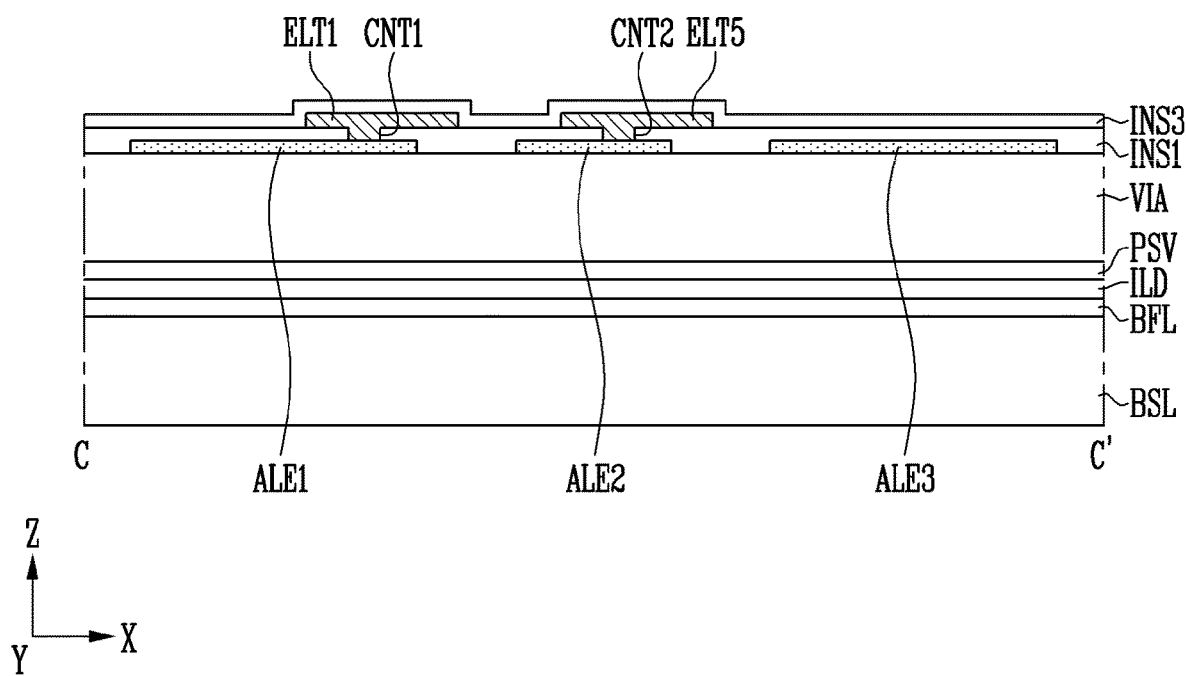

In an embodiment, the thickness T22 of the second area BNK22 of the second bank BNK2 with respect to the third direction (e.g., the Z-axis direction in FIGS. 19 and 20) may be the same thickness T1 as the first bank BNK1 with respect to the third direction (e.g., the Z-axis direction in FIGS. 19 and 20). In such an embodiment, the second area BNK22 of the second bank BNK2 may be provided in the opening OP in the first bank BNK1 so that the second area BNK22 of the second bank BNK2 connects the otherwise disconnected parts of the first bank BNK1 to each other.

The first area BNK21 and the second area BNK22 of the second bank BNK2 may be formed of the same material. For example, the first area BNK21 and the second area BNK22 of the second bank BNK2 may be integrally provided (or integrally formed). The first area BNK21 and the second area BNK22 of the second bank BNK2 may be concurrently (or simultaneously) formed through the same process.

Although in an embodiment the first bank BNK1 and the second bank BNK2 are formed of the same material, the present disclosure is not limited thereto. In other embodiments, the first bank BNK1 and the second bank BNK2 are formed of different materials.

In an embodiment, the first insulating layer INS1 may be formed on the electrodes ALE and/or the second bank BNK2. For example, the first insulating layer INS1 may cover the electrodes ALE in the non-emission area NEA in which the second bank BNK2 is not disposed. Furthermore, the first insulating layer INS1 may cover the first area BNK21 of the second bank BNK2 in the emission area EA. In such an embodiment, the first insulating layer INS1 disposed on the first area BNK21 of the second bank BNK2 may be surface treated to have increased hydrophilicity so that light emitting element ink can be easily provided into the first area BNK21 of the second bank BNK2. However, the present disclosure is not limited thereto. In other embodiments, the first insulating layer INS1 may be omitted from the first area BNK21 of the second bank BNK2.

The first insulating layer INS1 may be formed of a single layer or multiple layers and may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Referring to FIGS. 22 to 25, the light emitting elements LD are provided to the emission area EA. The light emitting elements LD may be prepared in a diffused form in the light emitting element ink and then supplied to each of the pixels PXL by an inkjet printing scheme or the like. For example, the light emitting elements LD may be diffused (or dispersed) in a volatile solvent and supplied to (or deposited to) each of the pixels PXL. Thereafter, an electric field is formed between the electrodes ALE when alignment signals are supplied to the electrodes ALE so that the light emitting elements LD may be aligned between the electrodes ALE.

After the light emitting elements LD are aligned, the solvent may be removed by a volatilization scheme or other schemes. In this way, the light emitting elements LD may be reliably arranged between the electrodes ALE. Hence, a desired kind and/or amount of light emitting elements LD may be supplied to the emission area EA enclosed by the first bank BNK1 and the second area BNK22 of the second bank BNK2. Furthermore, the light emitting elements LD may be provided in the first area BNK21 of the second bank BNK2, which is comparatively thin, and, thus, may be easily aligned between the electrodes ALE.

Referring to FIGS. 26 to 29, subsequently, the second insulating layer INS2 is formed on the light emitting element LD, and the first connection electrode ELT1, the third connection electrode ELT3, and/or the fifth connection electrode ELT5 is formed on one ends of the corresponding light emitting elements LD.

The second insulating layer INS2 may be partially formed on the light emitting elements LD so that the first and second ends EP1 and EP2 of the light emitting elements LD are exposed from the second insulating layer INS2. When the second insulating layer INS2 is formed on the light emitting elements LD after the alignment of the light emitting elements LD has been completed, the light emitting elements LD may not be removed (or moved) from the aligned positions.

The first connection electrode ELT1, the third connection electrode ELT3, and/or the fifth connection electrode ELT5 may contact the ends of the corresponding light emitting elements LD that are exposed from the second insulating layer INS2. The first connection electrode ELT1 may be electrically connected to the first electrode ALE1 through the first contactor CNT1 passing through the first insulating layer INS1. The fifth connection electrode ELT5 may be electrically connected to the second electrode ALE2 through the second contactor CNT2 passing through the first insulating layer INS1. Although the first connection electrode ELT1, the third connection electrode ELT3, and/or the fifth connection electrode ELT5 may be concurrently (or simultaneously) formed through the same process, the present disclosure is not limited thereto.

Subsequently, the third insulating layer INS3 may be formed on the first connection electrode ELT1, the third connection electrode ELT3, and/or the fifth connection electrode ELT5. The third insulating layer INS3 may cover the first connection electrode ELT1, the third connection electrode ELT3, and/or the fifth connection electrode ELT5 and may allow remaining ends of the corresponding light emitting elements LD to be exposed.

Thereafter, the second connection electrode ELT2 and/or the fourth connection electrode ELT4 may be formed on the remaining ends of the light emitting elements LD; thus, completing the display device. The second connection electrode ELT2 and the fourth connection electrode ELT4 may be concurrently (or simultaneously) formed through the same process, but the present disclosure is not limited thereto.

In the foregoing embodiments, electrodes are formed on the first bank and act as reflectors so that light output efficiency of a display panel may be enhanced. In addition, a second bank may both connect otherwise disconnected parts of the first bank that are separated from each other by an opening and form space in which light emitting elements can be provided in the emission area. Therefore, the degree of alignment of the light emitting elements may be enhanced.

The aspects and features of the present disclosure are not limited by the foregoing, and other various aspects and features are included herein.

It will be understood by those skilled in the art that various changes in form and details may be made to the embodiments described herein without departing from the spirit and scope of the present disclosure as defined by the appended claims and their equivalents. Therefore, the foregoing embodiments should be considered in a descriptive sense and not for purposes of limitation. The scope of the present disclosure is not defined by the detailed description of the present disclosure but by the appended claims and their equivalents, and all differences within the scope will be construed as being included in the present disclosure.

What is claimed is:

1. A display device comprising:
   a substrate having an emission area and a non-emission area;
   a first bank in the non-emission area of the substrate and having an opening;
   electrodes on the first bank and spaced apart from each other;
   a second bank on the electrodes; and
   light emitting elements on the second bank between the electrodes,
   wherein the second bank has a first area overlapping the light emitting elements and a second area in the opening in the first bank.

2. The display device according to claim 1, wherein a thickness of the second area of the second bank is greater than a thickness of the first area of the second bank.

3. The display device according to claim 1, wherein a thickness of the second area of the second bank is identical as a thickness of the first bank.

4. The display device according to claim 1, wherein the electrodes extend from the opening in the first bank.

5. The display device according to claim 1, further comprising signal lines on the substrate,
   wherein the electrodes are electrically connected to the signal lines through a contact opening.

6. The display device according to claim 5, wherein the second area of the second bank overlaps the contact opening.

7. The display device according to claim 1, further comprising an insulating layer on the electrodes.

8. The display device according to claim 7, further comprising connection electrodes on the insulating layer and electrically connected to the light emitting elements.

9. The display device according to claim 8, wherein the connection electrodes are electrically connected to the electrodes through a contact opening passing through the insulating layer.

10. The display device according to claim 7, wherein the second bank is between the electrodes and the insulating layer.

11. A method of fabricating a display device, the method comprising:
    forming a first bank having an opening in a non-emission area of a substrate;
    forming, on the first bank, electrodes spaced apart from each other;
    simultaneously forming a first area of a second bank on the electrodes and a second area of the second bank in the opening in the first bank; and
    providing light emitting elements to the first area of the second bank.

12. The method according to claim 11, wherein a thickness of the second area of the second bank is greater than a thickness of the first area of the second bank.

13. The method according to claim 11, wherein a thickness of the second area of the second bank is identical as a thickness of the first bank.

14. The method according to claim 11, wherein the electrodes extend from the opening in the first bank.

15. The method according to claim 11, further comprising:
    forming an insulating layer on the electrodes; and
    forming connection electrodes on the light emitting elements.

16. The method according to claim 15, wherein the connection electrodes are electrically connected to the electrodes through a contact opening passing through the insulating layer.

17. The method according to claim 15, further comprising surface-treating the insulating layer on the first area of the second bank.

18. The method according to claim 17, wherein the light emitting elements are on the insulating layer.

19. The method according to claim 11, wherein the first bank and the second bank are formed of an identical material.

20. The method according to claim 11, wherein the first bank and the second bank are formed of different materials.

* * * * *